US012757793B2

(12) United States Patent

Itakura et al.

(10) Patent No.: US 12,757,793 B2

(45) Date of Patent: Oct. 6, 2026

(54) ENCAPSULATING SEMICONDUCTOR CHIPS USING MASKS

(71) Applicant: Kioxia Corporation, Tokyo (JP)

(72) Inventors: Satoru Itakura, Tokyo (JP); Masayuki Miura, Tokyo (JP)

(73) Assignee: Kioxia Corporation, Tokyo (JP)

(*) Notice: Subject to any disclaimer, the term of this patent is extended or adjusted under 35 U.S.C. 154(b) by 373 days.

(21) Appl. No.: 18/458,023

(22) Filed: Aug. 29, 2023

(65) Prior Publication Data

US 2024/0105681 A1 Mar. 28, 2024

(30) Foreign Application Priority Data

Sep. 22, 2022 (JP) ................................ 2022-150875

(51) Int. Cl.

| | |
|---|---|
| ***H10W 90/00*** | (2026.01) |
| ***H10P 76/20*** | (2026.01) |
| ***H10W 74/01*** | (2026.01) |
| ***H10W 74/10*** | (2026.01) |
| ***H10W 74/47*** | (2026.01) |
| ***H10W 90/20*** | (2026.01) |
| ***H10W 90/24*** | (2026.01) |

(52) U.S. Cl.

CPC ......... *H10W 90/00* (2026.01); *H10P 76/2041* (2026.01); *H10W 74/01* (2026.01); *H10W 74/47* (2026.01); *H10W 90/291* (2026.01); *H10W 74/117* (2026.01); *H10W 90/24* (2026.01); *H10W 90/752* (2026.01); *H10W 90/754* (2026.01)

(58) Field of Classification Search

CPC . H10W 74/00–481; H10W 74/01–019; H10W 90/20–297; H10W 74/114–117; H10W 74/121

See application file for complete search history.

(56) References Cited

U.S. PATENT DOCUMENTS

| | | | | |
|---|---|---|---|---|
| 10,672,724 | B2 | 6/2020 | Yamamoto | |
| 10,892,251 | B2 | 1/2021 | Tsukiyama | |
| 2004/0251777 | A1* | 12/2004 | Yamamoto | H03H 9/059 310/313 R |
| 2013/0049221 | A1* | 2/2013 | Han | H10W 74/121 257/E23.116 |
| 2014/0070428 | A1 | 3/2014 | Tanimoto | |

(Continued)

FOREIGN PATENT DOCUMENTS

| | | | |
|---|---|---|---|
| JP | 2003069196 | A | 3/2003 |
| JP | 2014053538 | A | 3/2014 |

(Continued)

OTHER PUBLICATIONS

Japanese Office Action dated Jan. 6, 2026, mailed in counterpart Japanese Application No. 2022-150875, 12 pages.

*Primary Examiner* — Kevin Parendo

(74) *Attorney, Agent, or Firm* — Kim & Stewart LLP

(57) ABSTRACT

According to one embodiment, a method of manufacturing a semiconductor device includes placing a first semiconductor element on a wiring board, forming a first mask having an opening on the wiring board so that the first semiconductor element is positioned in the opening, putting a liquid first resin precursor into the opening of the first mask, curing the first resin precursor to obtain a first resin layer, and then removing the first mask.

9 Claims, 20 Drawing Sheets

(56) References Cited

U.S. PATENT DOCUMENTS

| | | | | |
|---|---|---|---|---|
| 2014/0231984 | A1 | 8/2014 | Chen | |
| 2015/0069601 | A1* | 3/2015 | Yamaguchi | H10W 74/47 438/126 |
| 2015/0200008 | A1 | 7/2015 | Ozawa | |
| 2020/0051957 | A1 | 2/2020 | Sano | |
| 2020/0303299 | A1 | 9/2020 | Takemoto | |
| 2020/0303346 | A1 | 9/2020 | Tsukiyama | |
| 2021/0013181 | A1* | 1/2021 | Han | H10W 74/121 |
| 2022/0005779 | A1 | 1/2022 | Niwa | |
| 2022/0059493 | A1 | 2/2022 | Okada | |

FOREIGN PATENT DOCUMENTS

| | | | |
|---|---|---|---|
| JP | 2015135875 | A | 7/2015 |
| JP | 2017165981 | A | 9/2017 |
| JP | 2020025022 | A | 2/2020 |
| JP | 2020155559 | A | 9/2020 |

* cited by examiner

*FIG. 29*

PLACING FIRST SEMICONDUCTOR ELEMENT ON WIRING BOARD HAVING PAD (S21)

APPLYING THIRD RESIN PRECURSOR ONTO WIRING BOARD AND FIRST SEMICONDUCTOR ELEMENT (S22)

FORMING THIRD RESIN LAYER BY IRRADIATING THIRD RESIN COMPOSITION WITH LIGHT TO CURE THIRD RESIN PRECURSOR (S23)

OPENING THIRD RESIN LAYER ON PAD (S24)

PLACING SECOND SEMICONDUCTOR ELEMENT ON THIRD RESIN LAYER (S25)

FORMING BONDING WIRE THAT CONNECTS PAD OF SECOND SEMICONDUCTOR ELEMENT TO PAD OF WIRING BOARD (S26)

FORMING FOURTH RESIN LAYER THAT SEALS THIRD RESIN LAYER AND SECOND SEMICONDUCTOR ELEMENT (S27)

*FIG. 30*

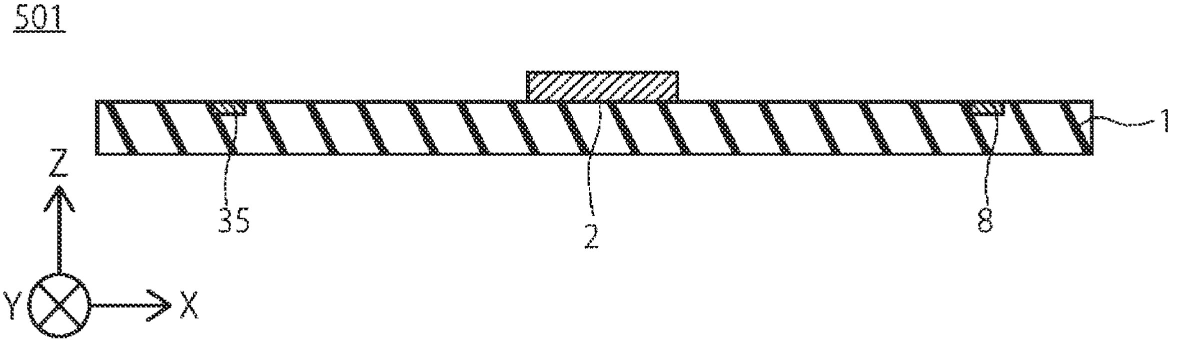

ENCAPSULATING SEMICONDUCTOR CHIPS USING MASKS

CROSS-REFERENCE TO RELATED APPLICATION

This application is based upon and claims the benefit of priority from Japanese Patent Application No. 2022-150875, filed Sep. 22, 2022, the entire contents of which are incorporated herein by reference.

FIELD

Embodiments described herein relate generally to a method of manufacturing a semiconductor device and a semiconductor device.

BACKGROUND

In a packaged device in which NAND flash memory chips are stacked, a controller chip on a wiring board may be sealed with a film-like insulating material.

BRIEF DESCRIPTION OF THE DRAWINGS

FIG. 29 is a flow chart of a method of manufacturing a semiconductor device according to one embodiment.

FIG. 30 is a schematic process diagram of the method of manufacturing a semiconductor device according to one embodiment.

DETAILED DESCRIPTION

Figure 1:
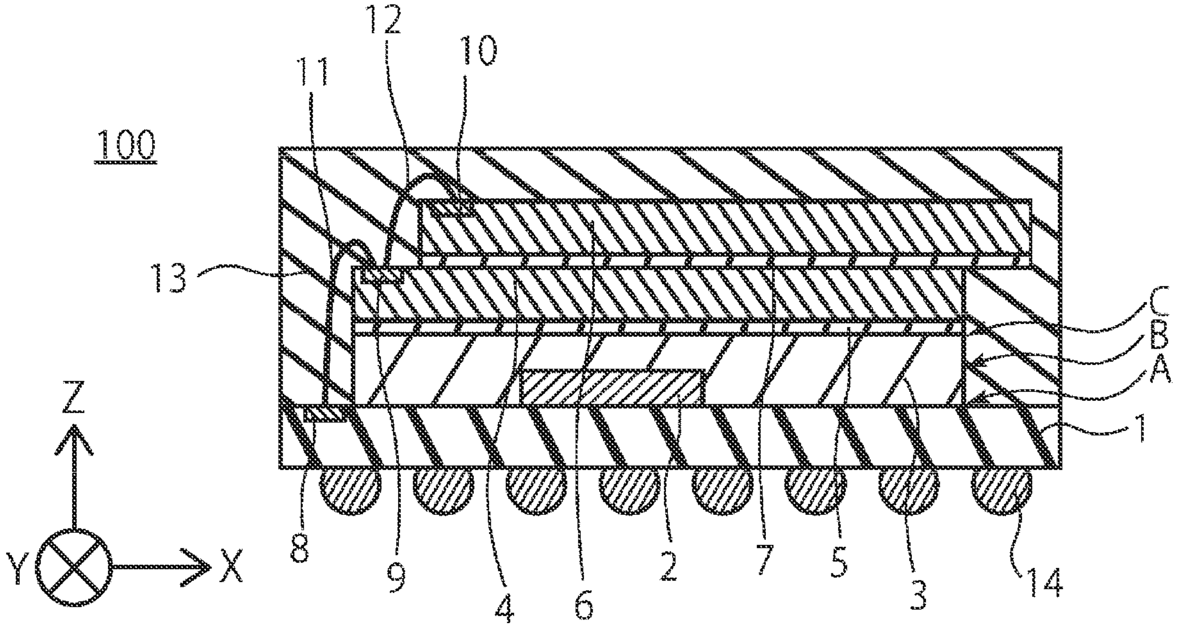
FIG. 1 is a schematic cross-sectional view of a semiconductor device according to one embodiment.

Embodiments provide a method of manufacturing a semiconductor device with a high yield and a semiconductor device with a high yield.

In general, according to one embodiment, a method of manufacturing a semiconductor device includes placing a first semiconductor element on a wiring board, forming a first mask having an opening on the wiring board so that the first semiconductor element is positioned in the opening, putting a liquid first resin precursor into the opening of the first mask, curing the first resin precursor to obtain a first resin layer, and then removing the first mask.

Hereinafter, certain example embodiments will be described with reference to the drawings.

The drawings are schematic, and any depicted relationship between thicknesses and planar dimensions, the ratio of thicknesses of different layers, and the like may differ from the actual ones. In addition, the depicted relationships and ratio of dimensions in the drawings may be different from each other drawing to drawing. Some drawings may be simplified by omission of certain components, aspects, or the like to focus explanation on other components, aspects, or the like.

In general, any physical property values described for the embodiments are the values at room temperature under atmospheric pressure unless otherwise indicated.

As used herein, the term "step" as in a "method step" or the like refers not only singular, independent step, but also combinations of multiple steps and/or other treatments.

First Embodiment

A first embodiment relates to a semiconductor device and a method of manufacturing a semiconductor device. FIG. 1 shows a schematic cross-sectional view of a semiconductor device 100. More specifically, the semiconductor device 100 of FIG. 1 is a semiconductor package (packed semiconductor or integrated circuit device) in which a NAND flash memory chip or the like is mounted.

An XY plane corresponds to the planar directions of wiring board 1, a first semiconductor element 2, a first resin layer 3, a second semiconductor element 4, a first intermediate layer 5, a third semiconductor element 6, a second intermediate layer 7 and a second resin layer 13. The Z direction is a stacking direction of each member.

The semiconductor device 100 is an example of a memory device. The semiconductor device 100 includes the wiring board 1, the first semiconductor element 2, the first resin layer 3, the second semiconductor element 4, the first intermediate layer 5, the third semiconductor element 6, the second intermediate layer 7, a pad 8, a pad 9, a pad 10, a bonding wire 11, bonding wires 12, a second resin layer 13, and solder balls 14.

The wiring board 1 is a supporting substrate for the first semiconductor element 2 and the like. The wiring board 1 is more specifically in this example a multilayer printed circuit board (PCB). The pad 8 and wiring in the board are provided for the wiring board 1. The first semiconductor element 2 is provided on a first surface side of the wiring board 1. Hemispherical electrodes, such as the solder balls 14, for external connection of the semiconductor device 100 are provided on a second surface side opposite to the first surface of the wiring board 1. One pad 8 is shown in the wiring board 1 of FIG. 1. Typically, the semiconductor device 100 will include a plurality of pads 8 and the single pad 8 should be taken as representative of multiple pads 8.

The first semiconductor element 2 is placed on the wiring board 1. When the semiconductor device 100 is a memory device, the first semiconductor element 2 is, for example, a controller chip. A controller chip is a semiconductor chip that controls reading, writing, erasing, or the like of a semiconductor memory chip.

The first semiconductor element 2 is a semiconductor element that differs in circuit configuration from both the second semiconductor element 4 and the third semiconductor element 6. Preferably, the first semiconductor element 2 is smaller in at least planar area than the second semiconductor element 4 and the third semiconductor element 6. The first semiconductor element 2 is electrically connected to the wiring board 1 via a conductive adhesive (for example, solder) or a wiring member which is wiring (for example, bonding wire). The first semiconductor element 2 can be electrically connected to the second semiconductor element 4 and the third semiconductor element 6 through the wiring board 1.

The first resin layer 3 may be a first resin material or a first resin material mixed with a first filler. The first resin layer 3 is insulating. The first resin layer 3 is provided on the wiring board 1. Preferably, the first resin layer 3 is in direct contact with a side surface of the first semiconductor element 2. Preferably, the first resin layer 3 seals (encapsulates) the first semiconductor element 2. More specifically, the first resin layer 3 seals the wiring members that connect to the first semiconductor element 2, the first semiconductor element 2, and portions of the wiring board 1, but does not seal (enclose) the bonding wire 11, the bonding wire 12, and the second semiconductor element 4, and the third semiconductor element 6. When an underfill is used between the first semiconductor element 2 and the wiring board 1, the first resin layer 3 seals this underfill, the wiring member connecting the first semiconductor element 2 and the wiring board 1, and the first semiconductor element 2. The first resin layer 3 shown in the schematic diagram of FIG. 1 seals the first semiconductor element 2. The first resin layer 3 is formed by curing a first resin precursor 3A with heat or the like.

Preferably, the first resin material can be one or more (in the case of two or more, either a mixture or a copolymer) selected from the group consisting of an epoxy resin, a phenol resin, a polyimide resin, a polyamide resin, an acrylic resin, a polybenzoxazole resin, a silicone resin, and a benzocyclobutene resin. Possible epoxy resins to be used are not particularly limited and include, for example, a bisphenol type epoxy resin such as bisphenol A-type, bisphenol F-type, bisphenol AD-type, and bisphenol S-type, a novolak-type epoxy resin such as phenol novolak type and cresol novolak-type, a resorcinol-type epoxy resin, an aromatic epoxy resin such as trisphenol methane triglycidyl ether, a naphthalene-type epoxy resin, a fluorene-type epoxy resin, a dicyclopentadiene-type epoxy resin, a polyether-modified epoxy resin, a benzophenone-type epoxy resin, an aniline-type epoxy resin, a nitrile butadiene rubber (NBR)-modified epoxy resin, a carboxyl-terminated butadiene-acrylonitrile (CTBN)-modified epoxy resin, and hydrogenates thereof, or the like. Among these, naphthalene-type epoxy resins and dicyclopentadiene-type epoxy resins are usually preferable because of their good adhesion to silicon. A benzophenone-type epoxy resin may also be preferable in some instances because it is easy to obtain rapid curability. These epoxy resins examples may be used alone or in combination with each other.

Preferably, the first filler contained in the first resin layer 3 is silica and/or alumina. Preferably, an average primary diameter of the first filler is between 1 μm and 100 μm.

The second semiconductor element 4 is placed on the first resin layer 3 via the first intermediate layer 5. The third semiconductor element 6 is placed on the second semiconductor element 4 via the second intermediate layer 7. The second semiconductor element 4 and the third semiconductor element 6 are, for example, semiconductor memory chips. The semiconductor memory chip is a semiconductor chip to which data can be written and from which data can be read. In embodiments, a non-volatile memory chip or a volatile memory chip can be used as the semiconductor memory chip. A NAND memory chip, a phase-change memory chip, a resistance change memory chip, a ferroelectric memory chip, a magnetic memory chip, or the like can be used as the non-volatile memory chip. A Dynamic Random Access Memory (DRAM) or the like can be used as the volatile memory chip.

Preferably, the semiconductor memory chips provided in the semiconductor device 100 are semiconductor chips with the same structure having the same circuit design. For example, the second semiconductor element 4 and the third semiconductor element 6 are semiconductor memory chips with the same structure having the same circuit except for minor differences.

Preferably, the semiconductor device 100 includes two or more semiconductor memory chips. When the semiconductor device 100 includes two or more semiconductor memory chips, the plurality of semiconductor memory chips can be stacked while being shifted from the one below the other in either the +X direction and/or the −X direction). When the semiconductor device 100 includes two or more semiconductor memory chips, semiconductor memory chips can be stacked with each being shifted from the one below the other in either the (+Y direction and/or the −Y direction. Embodiments also encompass a semiconductor device having only one semiconductor memory chip.

The second semiconductor element 4 has a pad 9. The second semiconductor element 4 is electrically connected to the wiring board 1 through the bonding wire 11 connecting the pads 8 and 9. Although one pad 9 is shown in FIG. 1, generally, a plurality of the pads 9 are arranged in the Y direction.

The third semiconductor element 6 has the pad 10. The third semiconductor element 6 is electrically connected to the second semiconductor element 4 and the wiring board 1 through the bonding wire 12 connecting the pads 9 and 10. Although one pad 10 is shown in FIG. 1, preferably, a plurality of the pads 10 are arranged in the Y direction.

As shown in the semiconductor device 100 of FIG. 1, widths (dimensions in the X direction) of the first resin layer 3 and the second semiconductor element 4 may be the same or different.

A plate-like member such as bare silicone may be included between the first resin layer 3 and the first intermediate layer 5. When the plate-like member is present, an adhesive layer is present between the plate-like member and the first resin layer 3, and the first intermediate layer 5 is positioned between the plate-like member and the second semiconductor element 4.

Preferably, a side surface of the first resin layer 3 is perpendicular or substantially perpendicular to a surface of the wiring board 1. Preferably, an angle of the side surface of the first resin layer 3 with respect to the surface of the wiring board 1 is between 85° and 95°.

In the present drawings, the side surface of the first resin layer 3 sealing the first semiconductor element 2 is generally drawn perpendicular to the surface of the wiring board 1, but such may vary to some extent. For example, when the first semiconductor element 2 is sealed using a die attach film (DAF) or the like, a central portion and/or a bottom surface portion (wiring board 1 side) of the DAF swells more easily than an upper surface portion (second semiconductor element 4 side). When the central portion and/or the bottom surface portion of the DAF swell from the upper surface portion, the bonding wire 11 is likely to be poorly formed. When the side surface of the first resin layer 3 swells, since the upper surface (the second semiconductor element 4 side) of the first resin layer 3 on which the second semiconductor element 4 is placed tends to swell, the surface on which the second semiconductor element 4 is placed will not be flat, so stress is likely to occur on the second semiconductor element 4 and the third semiconductor element 6 placed on the second semiconductor element 4.

The angle of the side surface of the first resin layer 3 with respect to the surface of the wiring board 1 can be measured, for example, as follows. In the cross-sectional view of the semiconductor device 100, a lower end of an outer surface of the first resin layer 3 is referred to as a point A. In the cross-sectional view, a center of the outer surface of the first resin layer 3 is referred to as a point B. In the cross section, an upper end of the first resin layer 3 is referred to as a point C. An angle between a line segment AB connecting the points A and B and the surface of the wiring board 1, and an angle between a line segment BC connecting the points B and C and the surface of the wiring board 1 are referred to as an angle of the side surface of the first resin layer 3 with respect to the surface of the wiring board 1. The two angles are preferably perpendicular or substantially perpendicular. For example, the two angles are each between 85° and 95°.

The first intermediate layer 5 is provided between the first resin layer 3 and the second semiconductor element 4. The first intermediate layer 5 adheres the second semiconductor element 4 to the first resin layer 3. The first intermediate layer 5 is an insulating resin layer. The first intermediate layer 5 comprises, for example, an epoxy resin. The first intermediate layer 5 is, for example, a layer obtained by curing an adhesive layer such as a DAF or the like.

The second intermediate layer 7 is provided between the second semiconductor element 4 and the third semiconductor element 6. The second intermediate layer 7 adheres the third semiconductor element 6 to the second semiconductor element 4. The second intermediate layer 7 is an insulating resin layer. The second intermediate layer 7 is, for example, an epoxy resin. The second intermediate layer 7 is, for example, a layer obtained by curing an adhesive layer of DAF.

The second resin layer 13 comprises a second resin and a second filler. The second resin layer 13 is insulating. The second resin layer 13 seals the first resin layer 3, the second semiconductor element 4, the third semiconductor element 6, the first intermediate layer 5, the second intermediate layer 7, the bonding wire 11 and the bonding wire 12. The second resin layer 13 is a member formed by curing a second resin precursor 13A (containing a second filler) by heat or the like.

Preferably, the second resin includes one or more (in the case of two or more, including mixture and copolymer) selected from the group consisting of an epoxy resin, a phenol resin, a polyimide resin, a polyamide resin, an acrylic resin, a polybenzoxazole resin, a silicone resin, and a benzocyclobutene resin. Possible epoxy resins to be used are not particularly limited, and include, for example, a bisphenol-type epoxy resin such as bisphenol A-type, bisphenol F-type, bisphenol AD-type, and bisphenol S-type, a novolak-type epoxy resin such as phenol novolak-type and cresol novolak-type, a resorcinol-type epoxy resin, an aromatic epoxy resin such as trisphenol methane triglycidyl ether, a naphthalene-type epoxy resin, a fluorene-type epoxy resin, a dicyclopentadiene-type epoxy resin, a polyether-modified epoxy resin, a benzophenone-type epoxy resin, an aniline-type epoxy resin, a NBR-modified epoxy resin, a CTBN-modified epoxy resin, and hydrogenates thereof, or the like. Among these examples, naphthalene-type epoxy resins and dicyclopentadiene-type epoxy resins may be considered preferable in certain instances because of their good adhesion to silicon. A benzophenone-type epoxy resin is also preferable in some instances because it is easy to obtain rapid curability. These epoxy resins may be used alone or in combination with each other.

Preferably, the second filler provided in the second resin layer 13 can be silica particles and/or alumina particles. Preferably, an average primary diameter of the second filler is between 1 μm and 100 μm.

The solder balls 14 are external connection terminals electrically connected to the outside of the semiconductor device 100. When the semiconductor device 100 is a Ball Grid Array (BGA) package, the plurality of solder balls 14 are provided in the semiconductor device 100. Appropriate members are selected for the external connection terminals according to a package form of the semiconductor device.

When the semiconductor device 100 is a memory device, the swelling (protrusion in the X and Y directions) of the first resin layer 3 may increase as the size of the first semiconductor element 2, which is a controller chip, increases. Preferably, a bonding wire is disposed near the outside of the first resin layer 3 to reduce the swelling of the first resin layer 3. Since the side surface of the first resin layer 3 is perpendicular or substantially perpendicular to the surface of the wiring board 1, the swelling is reduced. Improving the mold-ability in the first resin layer 3 has the advantage of reducing stress even when the number of layers of memory increases as the capacity of the memory device increases.

Figure 2:
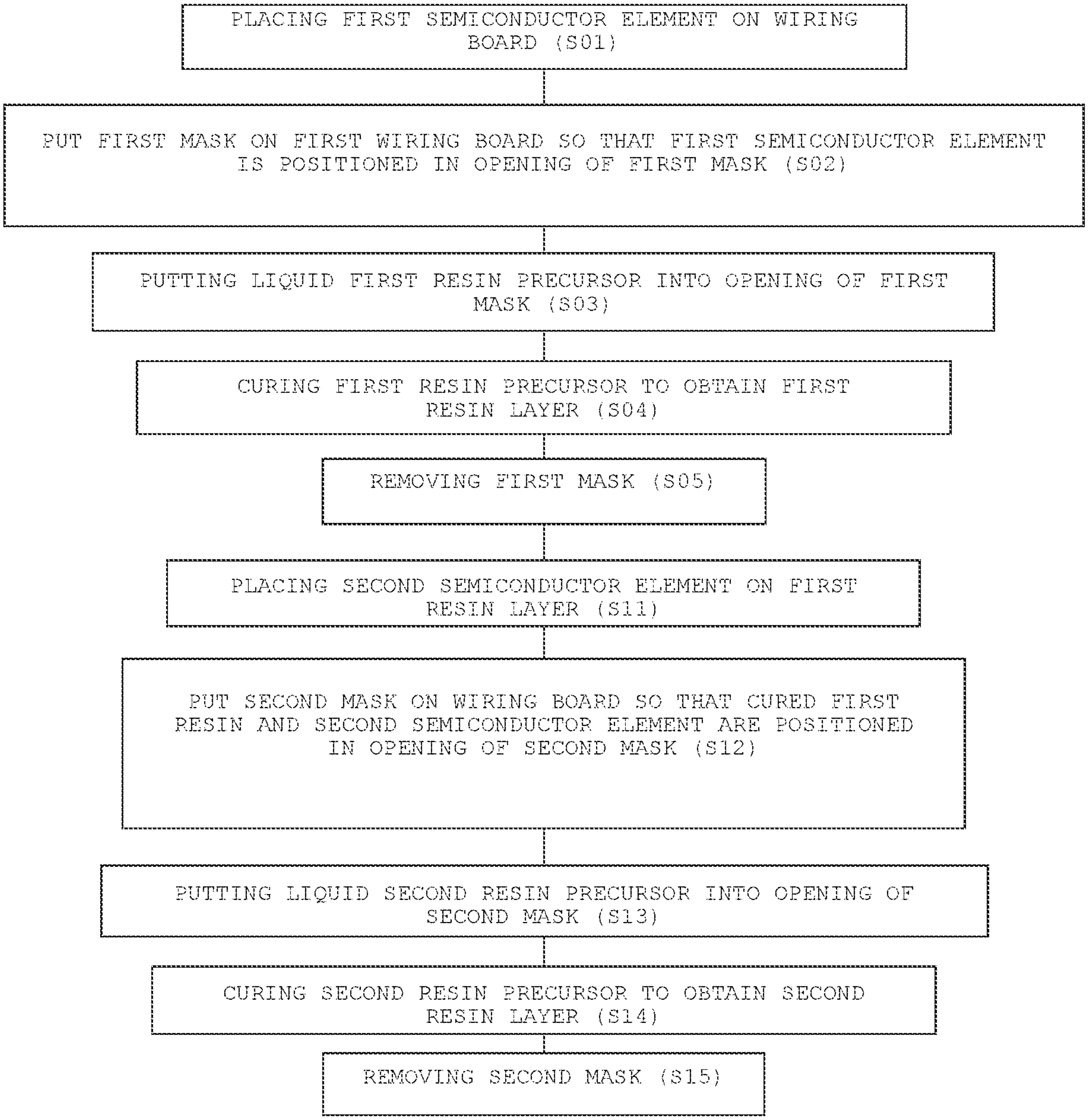
FIG. 2 is a flow chart of a method of manufacturing a semiconductor device according to one embodiment.

Next, a method of manufacturing the semiconductor device 100 will be described. Although some methods of manufacturing the semiconductor device 100 are exemplified in the specification, for example, other methods may be adopted as a method of forming the first resin layer 3 and a method of forming the second resin layer 13. FIG. 2 shows a flow chart of the method of manufacturing the semiconductor device 100. FIGS. 3 to 22 show schematic process diagrams of the semiconductor device 100. In the process diagrams, reference numerals of some members are omitted. The schematic process diagrams of FIGS. 3, 5, 7, 9, 11, 13, 15, 17, 19 and 21 are top schematic process diagrams. The schematic process diagrams of FIGS. 4, 6, 8, 10, 12, 14, 16, 18, 20 and 22 are cross-sectional schematic process diagrams. The schematic cross-sectional view of FIG. 1 shows the wiring board 1 of the semiconductor device 100 after being fragmented, and in the schematic process diagrams, the wiring board before being fragmented is shown by a wiring board 1A.

The method of manufacturing the semiconductor device 100 includes a step (S01) of placing the first semiconductor elements 2 on the wiring board 1A, a step (S02) of putting the first mask 20 on the wiring board 1A so that the first semiconductor elements 2 are positioned in openings of the first mask 20, a step (S03) of putting liquid first resin precursor 3A into the openings of the first mask 20, a step (S04) of curing the first resin precursor 3A to obtain the first resin layers 3, a step (S05) of removing the first mask 20, a step (S11) of placing the second semiconductor elements 4 on the first resin layers 3, a step (S12) of using a second mask 21 having openings to put the second mask 21 on the wiring board LA so that the first resin layers 3 and the second semiconductor elements 4 are positioned in the openings of the second mask 21, a step (S13) of putting the liquid second resin precursor 13A into the openings of the second mask 21, a step (S14) of curing the second resin precursor 13A to obtain the second resin layers 13, and a step (S15) of removing the second mask 21.

Figure 3:
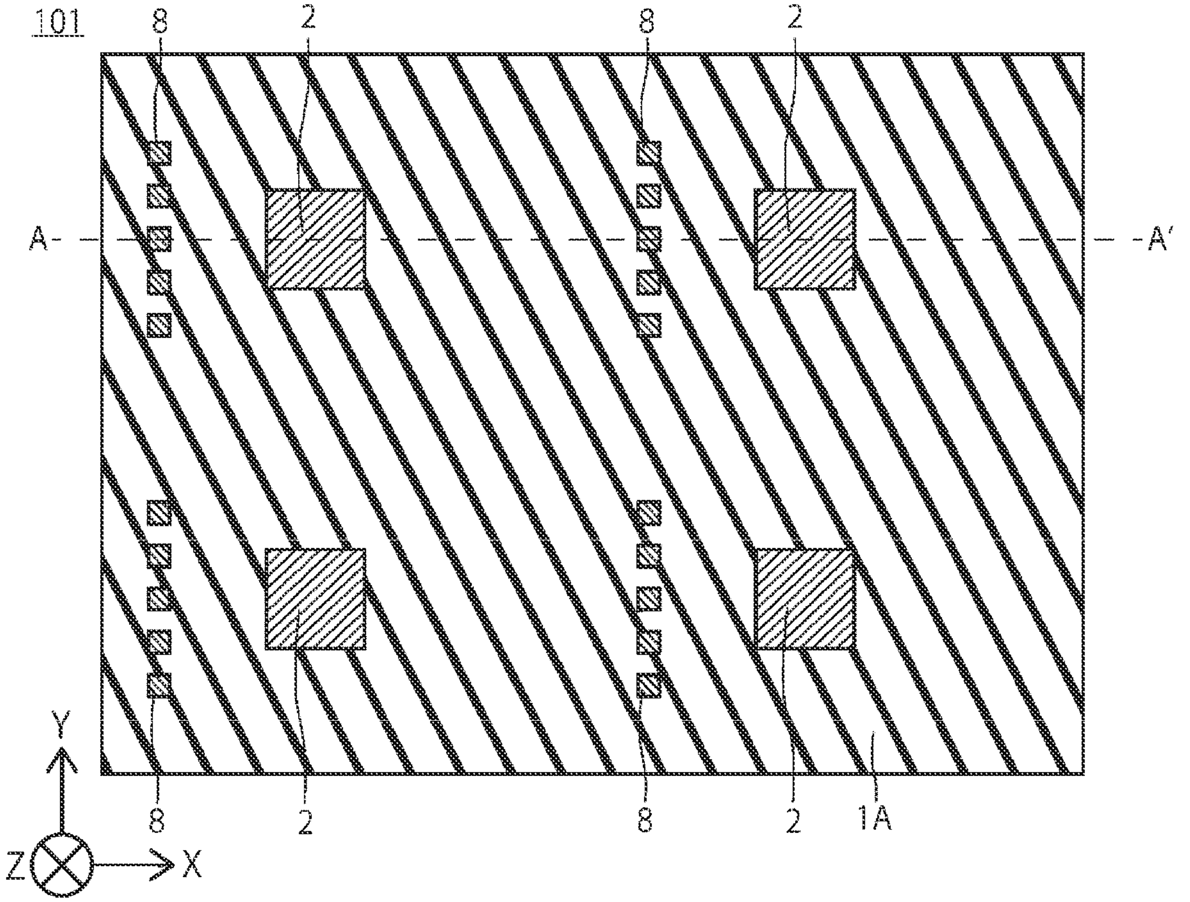
FIG. 3 is a top schematic process diagram of the method of manufacturing a semiconductor device according to one embodiment.
Figure 4:
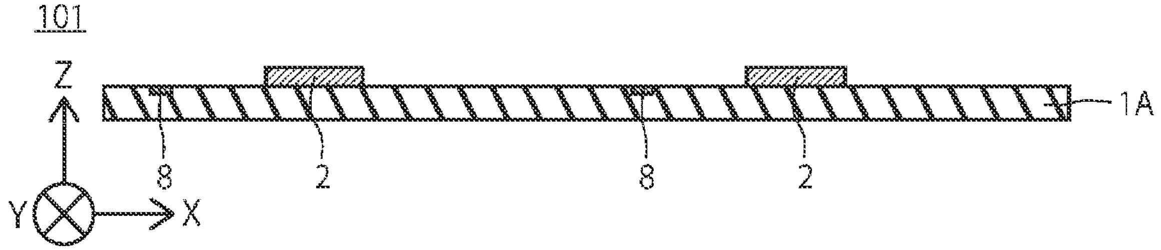
FIG. 4 is a cross-sectional schematic process diagram of the method of manufacturing a semiconductor device according to embodiment.

The step (S01) of placing the first semiconductor elements 2 on the wiring board 1A will be described with reference to the schematic process diagrams of FIGS. 3 and 4. The wiring board LA is a member that becomes the wiring board 1 of the semiconductor device 100 after being fragmented (e.g., diced, cut, etc.). A wiring board LA from which four semiconductor devices 100 can be obtained is shown in the schematic process diagrams of FIGS. 3 and 4. A cross-sectional view taken along line AA' in the top schematic process diagram of FIG. 3 is shown in the cross-sectional schematic process diagram of FIG. 4. The position of the cross section is the same in other cross-sectional schematic process diagrams.

The pads 8 are provided on the wiring board LA. For simplicity of illustration, the number of pads 8 is shown is less than the number of pads of an actual product. The schematic process diagrams of FIGS. 3 and 4 show a member 101 in which the first semiconductor elements 2 are placed on the wiring board 1A. When the first semiconductor element 2 is a flip chip, the first semiconductor element 2 is positioned on a region where a pad on the wiring board 1A is located. A conductive adhesive and a pad are on a back surface side of the first semiconductor element 2, and the first semiconductor element 2 and the wiring board 1 are connected via the conductive adhesive.

Figure 5:
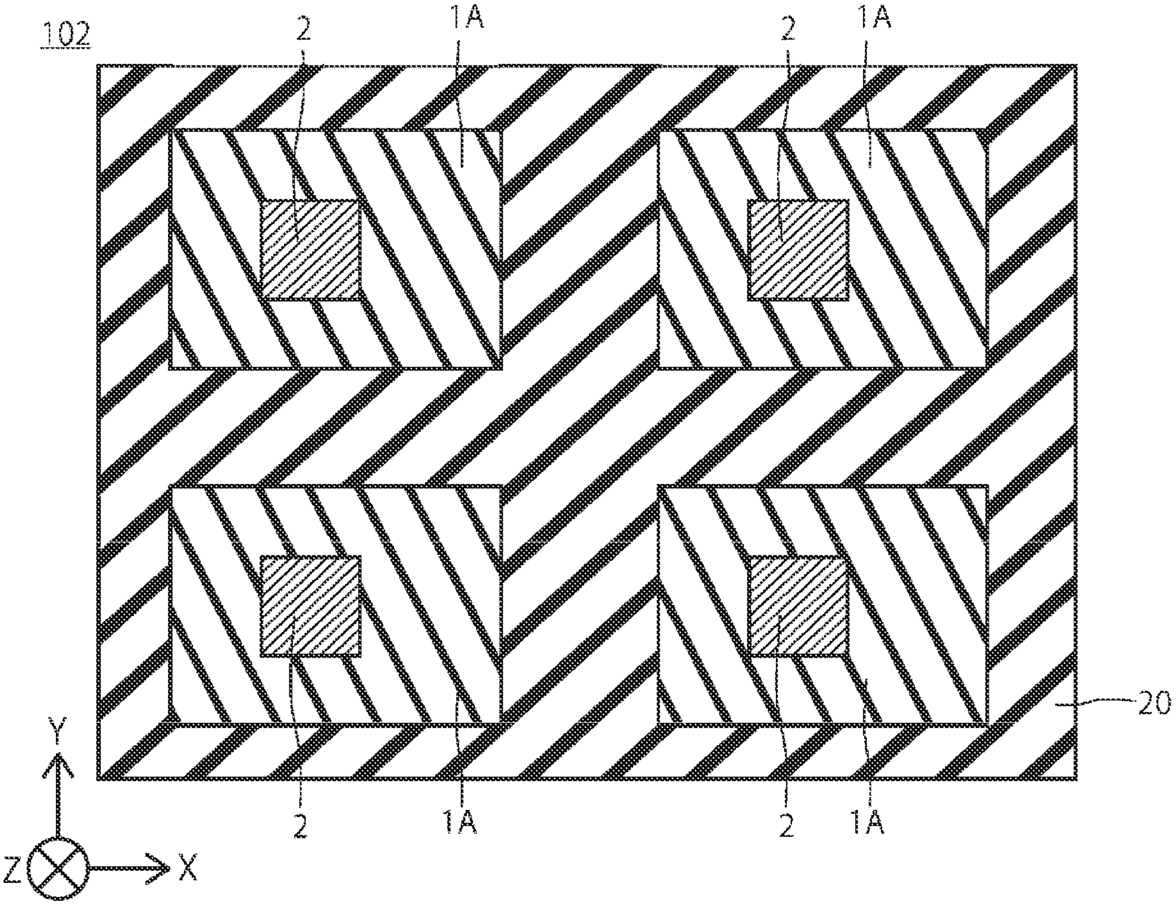
FIG. 5 is a top schematic process diagram of the method of manufacturing a semiconductor device according to one embodiment.
Figure 6:
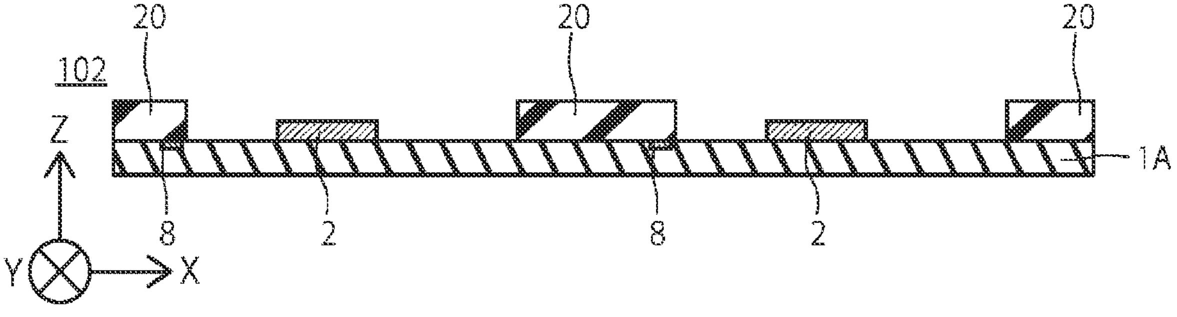
FIG. 6 is a cross-sectional schematic process diagram of the method of manufacturing a semiconductor device according to one embodiment.

Referring to the schematic process diagrams of FIGS. 5 and 6, for step (S02) the first mask 20 is placed or otherwise formed on the wiring board 1A so that the first semiconductor elements 2 are positioned in the openings of the first mask 20. As shown in the schematic process diagrams of FIGS. 5 and 6, the first mask 20 is put or formed on the wiring board 1A so that the first semiconductor elements 2 are each positioned in an opening, thereby obtaining a member 102 as depicted. The pads 8 of the wiring board 1A are hidden (covered) by the first mask 20. The position and size of the first resin layer 3 to be formed can be adjusted by the position and size of the openings of the first mask 20. Preferably, the side surface of the first mask 20 is perpendicular or substantially perpendicular to the wiring board 1A. A height of the first mask 20 (a depth of the opening of the first mask 20) is selected according to an intended thickness of the first resin layer 3. Preferably, the first mask 20 is a metal mask or a heat-resistant photosensitive resist material, for example.

Figure 7:
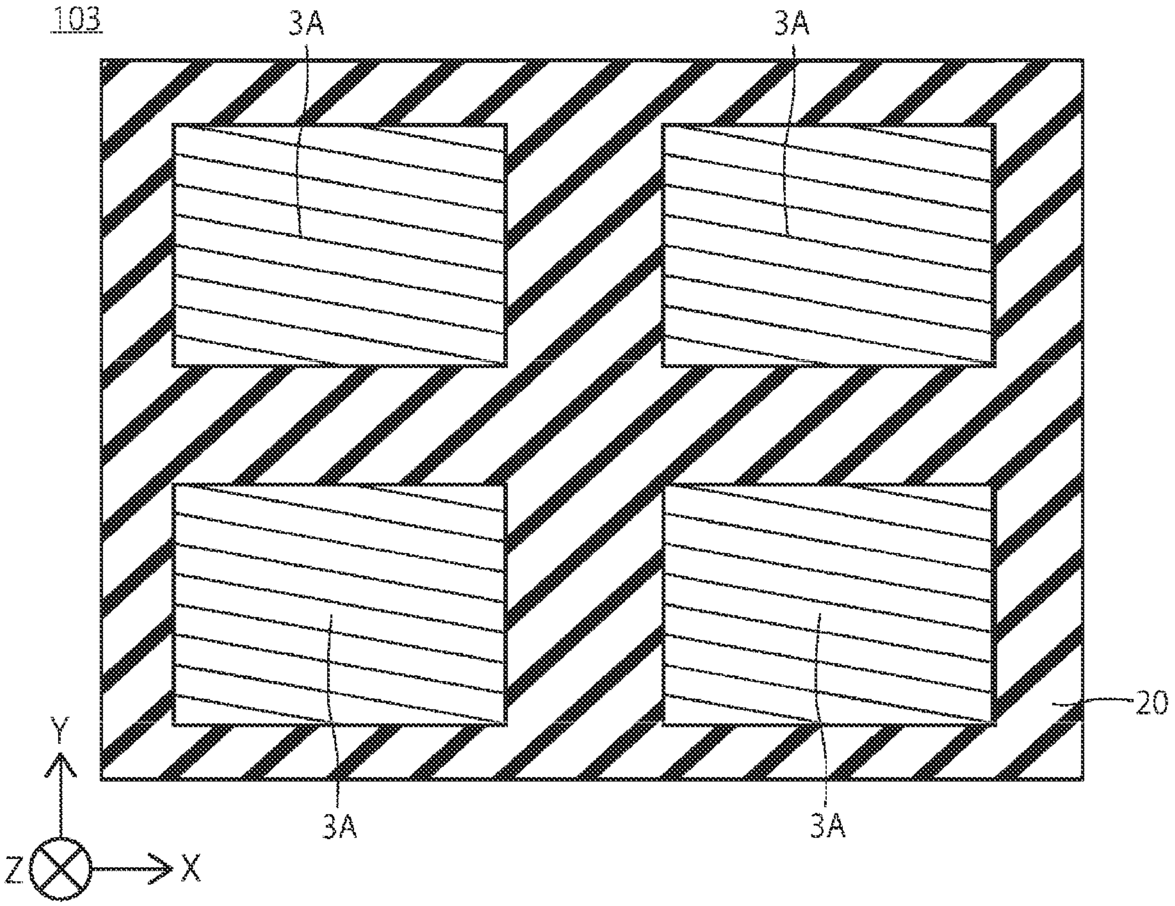
FIG. 7 is a top schematic process diagram of the method of manufacturing a semiconductor device according to one embodiment.
Figure 8:
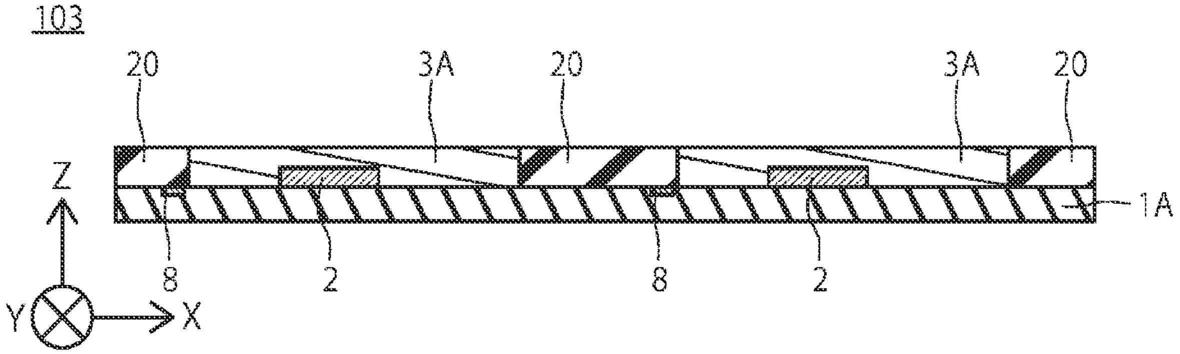
FIG. 8 is a cross-sectional schematic process diagram of the method of manufacturing a semiconductor device according to one embodiment.

Referring to the schematic process diagrams of FIGS. 7 and 8, the step (S03) of putting the liquid first resin precursor 3A into the openings of the first mask 20 will be described. The liquid first resin precursor 3A, which is precursor of the first resin layers 3, is placed into the openings of the first mask 20 of the member 102 to obtain the member 103. The liquid first resin precursor 3A is put into the openings of the first mask 20 by direct dropping and/or a coating process. Screen printing can be used for the application of the liquid first resin precursor 3A to the openings of the first mask 20. Since the first resin precursor 3A is cured or otherwise hardened by heating while the first mask 20 is still on the wiring board LA, it is preferable that the first mask 20 is a material having sufficient heat-resistance to withstand the curing process. The height of the first mask 20 and the heights of the first resin precursor 3A in the cross-sectional schematic process diagram of FIG. 8 are substantially the same. Preferably, the amount of the first resin precursor 3A in the openings before curing is equal to or less than the full volume of the openings of the first mask 20.

When the viscosity of the first resin precursor 3A is high, mold-ability will be poor, and the surface of the first resin layer 3 after curing may be difficult to flatten (planarize). Therefore, preferably, the viscosity of the first resin precursor 3A before curing is between 1 Pa·s and 200 Pa·s at 25° C. More preferably, the viscosity is 100 Pa·s or less, and still more preferably 50 Pa·s or less.

Figure 9:
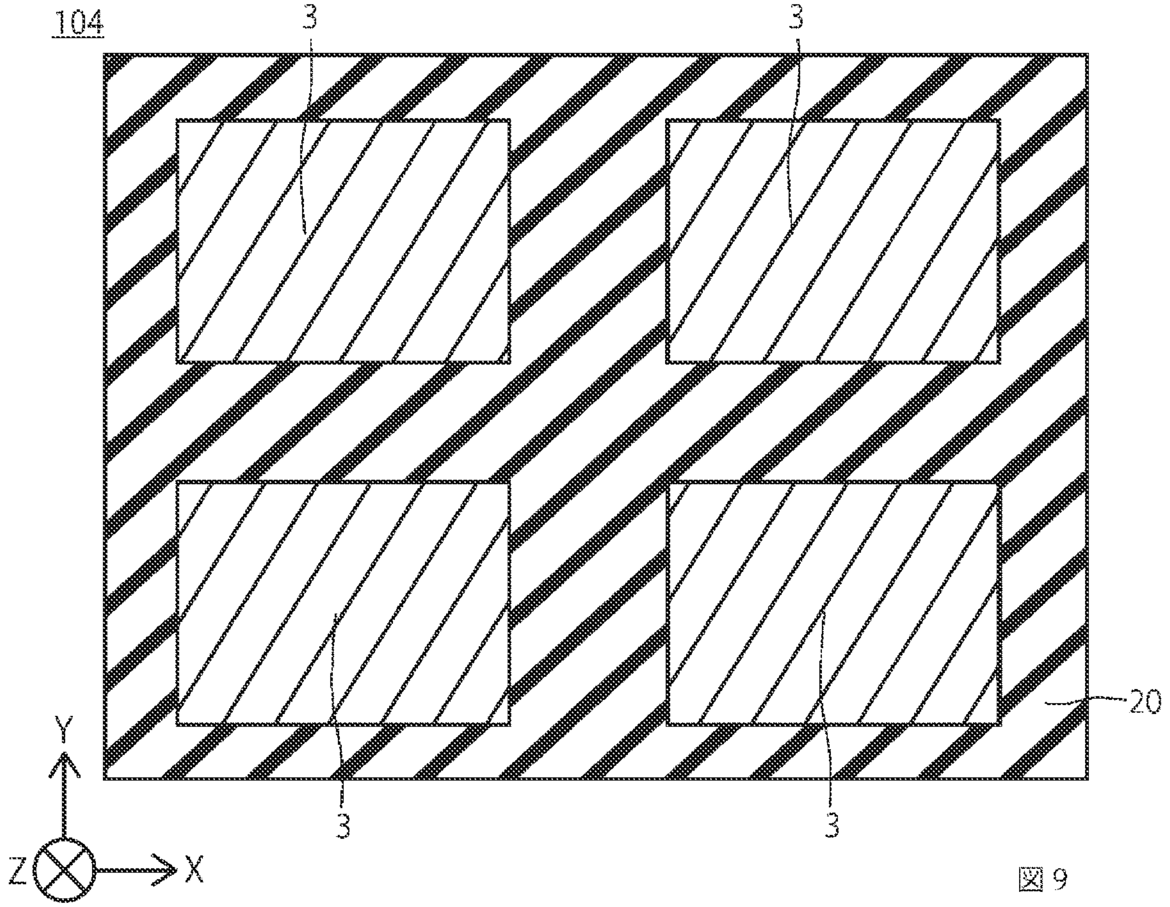
FIG. 9 is a top schematic process diagram of the method of manufacturing a semiconductor device according to one embodiment.
Figure 10:
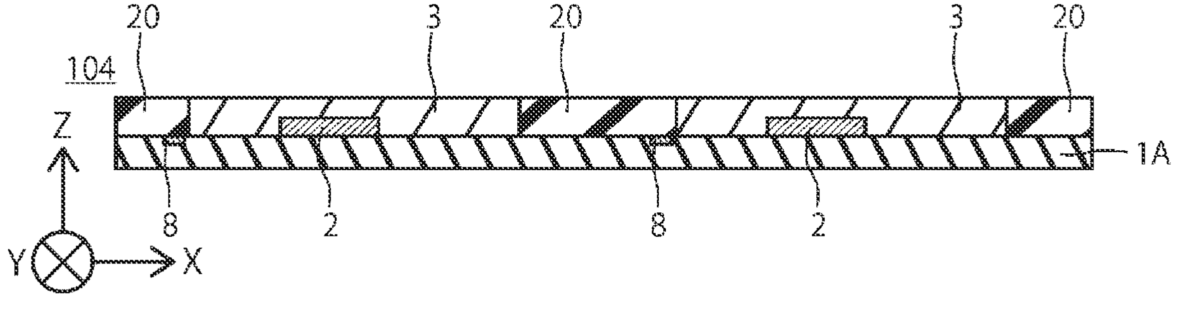
FIG. 10 is a cross-sectional schematic process diagram of the method of manufacturing a semiconductor device according to one embodiment.

Referring to the schematic process diagrams of FIGS. 9 and 10, the step (S04) of curing the first resin precursor 3A to obtain the first resin layers 3 will be described. A member 104 is obtained by curing the first resin precursor 3A while the first mask 20 of the member 103 is on the wiring board LA. The first resin precursor 3A is cured, for example, by heating. The first resin precursor 3A may not be completely cured by this step (S04). In this step (S04), when the first resin precursor 3A is not completely cured, the first resin precursor 3A will be further cured when heating treatment is performed in a later process step. The heating temperature in this step (S04) is typically between 100° C. and 250° C.

Figure 11:
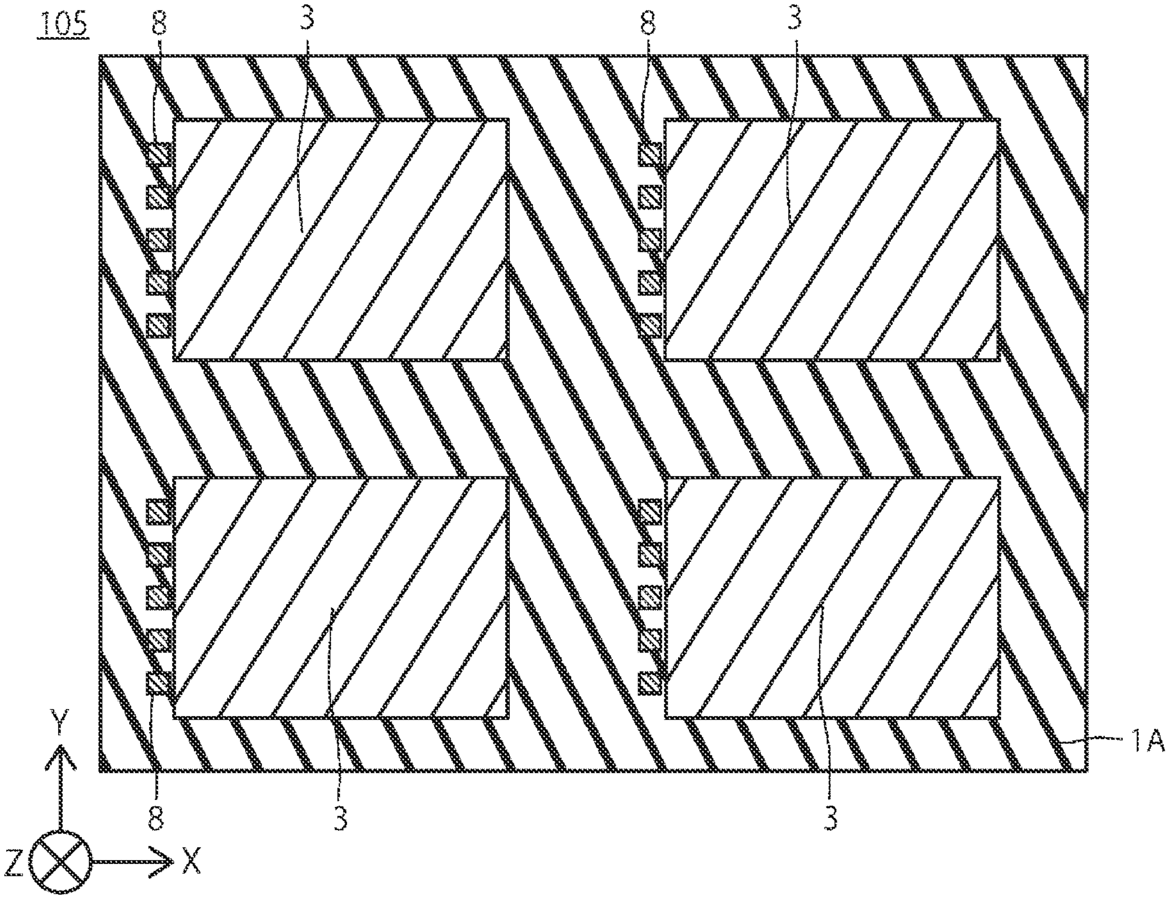
FIG. 11 is a top schematic process diagram of the method of manufacturing a semiconductor device according to one embodiment.
Figure 12:
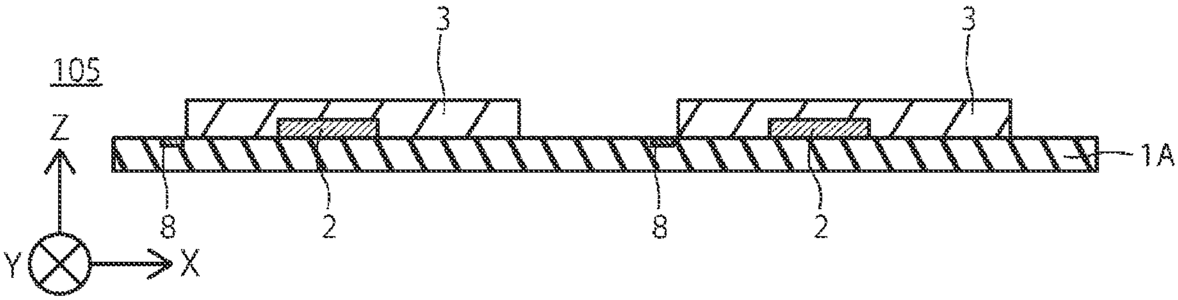
FIG. 12 is a cross-sectional schematic process diagram of the method of manufacturing a semiconductor device according to one embodiment.

Referring to the schematic process diagrams of FIGS. 11 and 12, the step (S05) of removing the first mask 20 will be described. A member 105 is obtained by removing the first mask 20 from the member 104 on which the first resin precursor 3A is cured. By removing the first mask 20 after the curing, the side surface of each first resin layer 3 will be perpendicular or substantially perpendicular to the surface of the wiring board LA.

Figure 13:
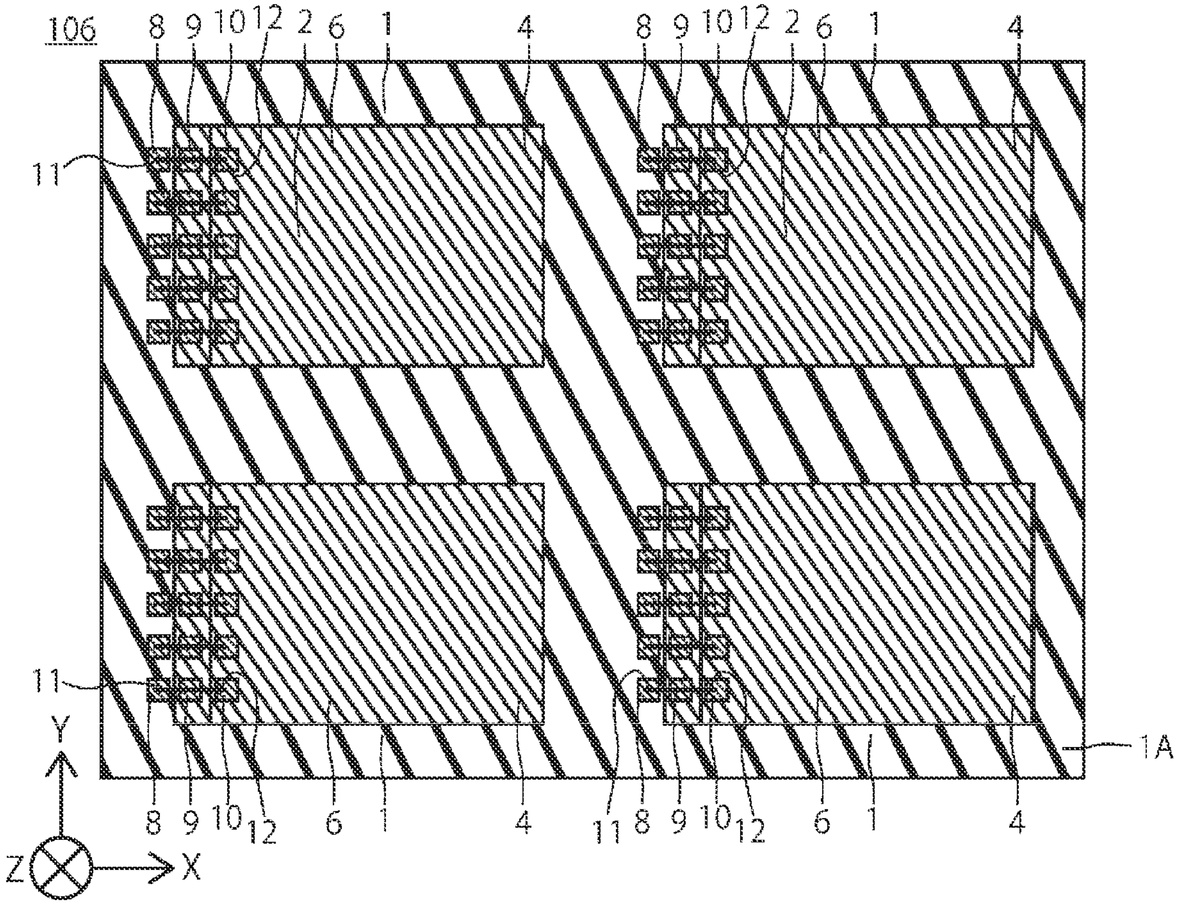
FIG. 13 is a top schematic process diagram of the method of manufacturing a semiconductor device according to one embodiment.
Figure 14:
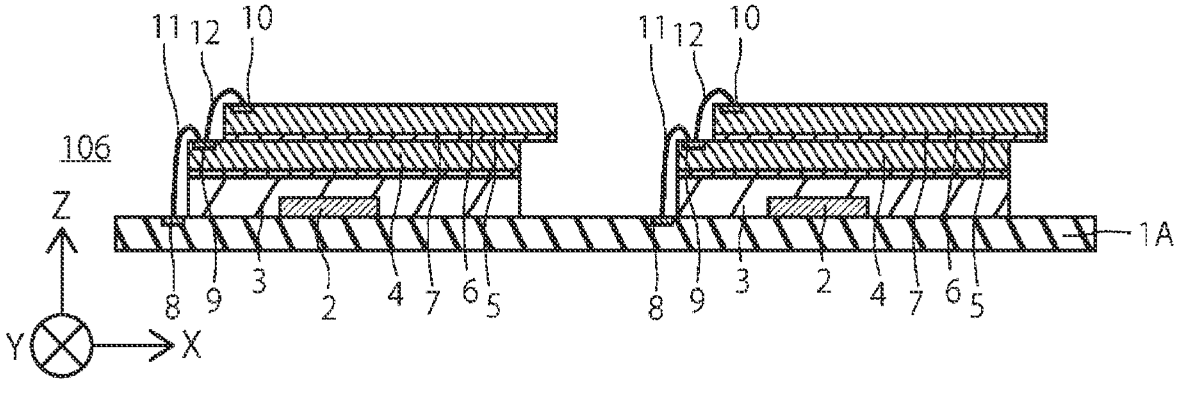
FIG. 14 is a cross-sectional schematic process diagram of the method of manufacturing a semiconductor device according to one embodiment.

Referring to the schematic process diagrams of FIGS. 13 and 14, the step (S11) of placing the second semiconductor elements 4 on the first resin layers 3 will be described. The second semiconductor elements 4 can be placed on the first resin layers 3 of the member 105 after the first mask 20 is removed. When a semiconductor device having the third semiconductor element 6 on the second semiconductor element 4 like the semiconductor device 100 of FIG. 1 is being produced, the third semiconductor element 6 is also placed. Then, the bonding wires 11 and 12 are formed to obtain a member 106. A first intermediate layer 5 is provided on a lower surface of each second semiconductor element 4, and the second semiconductor element 4 and the first intermediate layer 5 are stacked and adhered. A second intermediate layer 7 is provided on a lower surface of each third semiconductor element 6, and the third semiconductor element 6 and the second intermediate layer 7 are stacked and adhered. When the number of memory chips is three or more, another semiconductor element can be stacked on the third semiconductor element 6.

Figure 15:
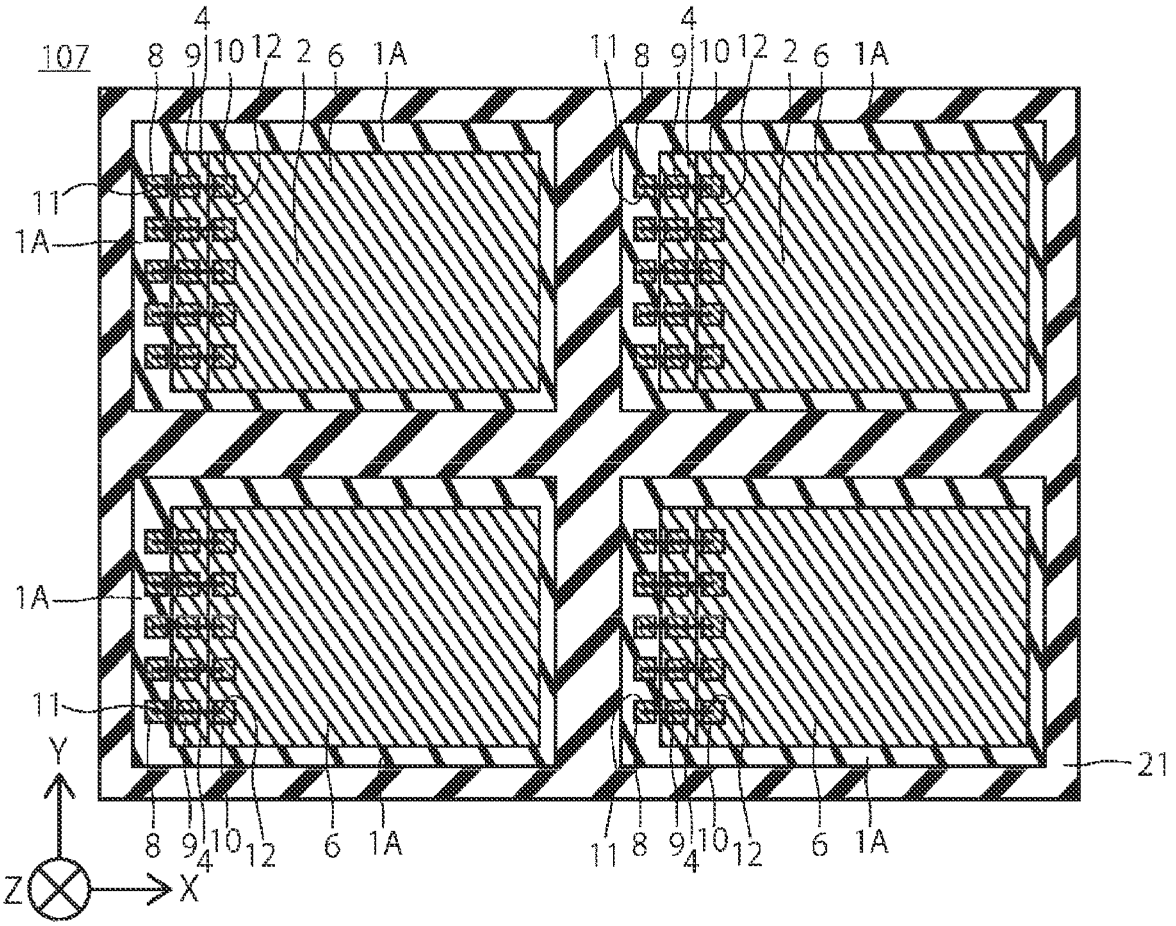
FIG. 15 is a top schematic process diagram of the method of manufacturing a semiconductor device according to one embodiment.
Figure 16:
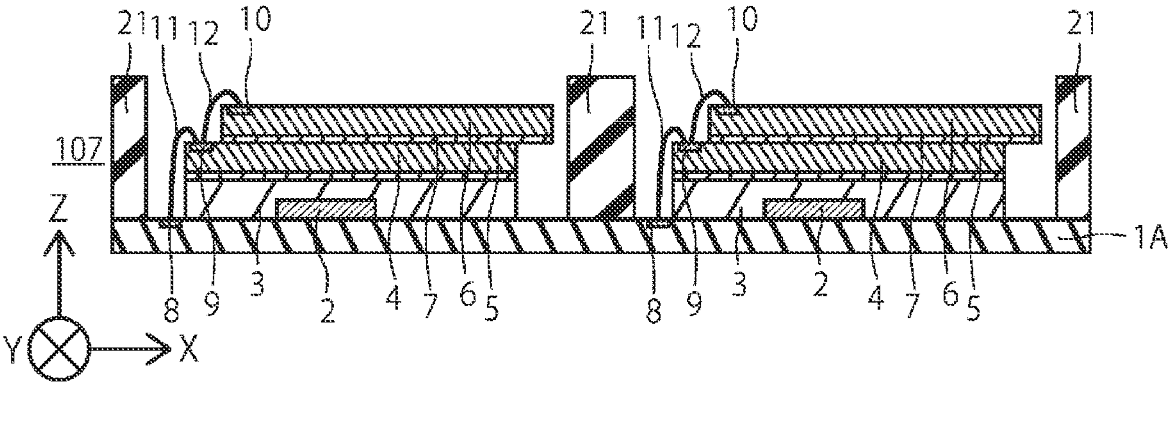
FIG. 16 is a cross-sectional schematic process diagram of the method of manufacturing a semiconductor device according to one embodiment.

Referring to the schematic process diagrams of FIGS. 15 and 16, the step (S12) of using the second mask 21 will be described. The second mask 21 is placed on the wiring board LA. The second mask 21 has openings, and a member 107 is obtained by placing the second mask 21 so that the first resin layers 3 and the second semiconductor elements 4 are positioned in the openings of the second mask 21. A height of an upper end of the second mask 21 is higher than the highest component (the bonding wire 12 in the case of the semiconductor device 100) among the components to be sealed with the second resin layer 13. Preferably, the second mask 21 is a metal mask or a heat-resistant photosensitive resist material, for example.

Figure 17:
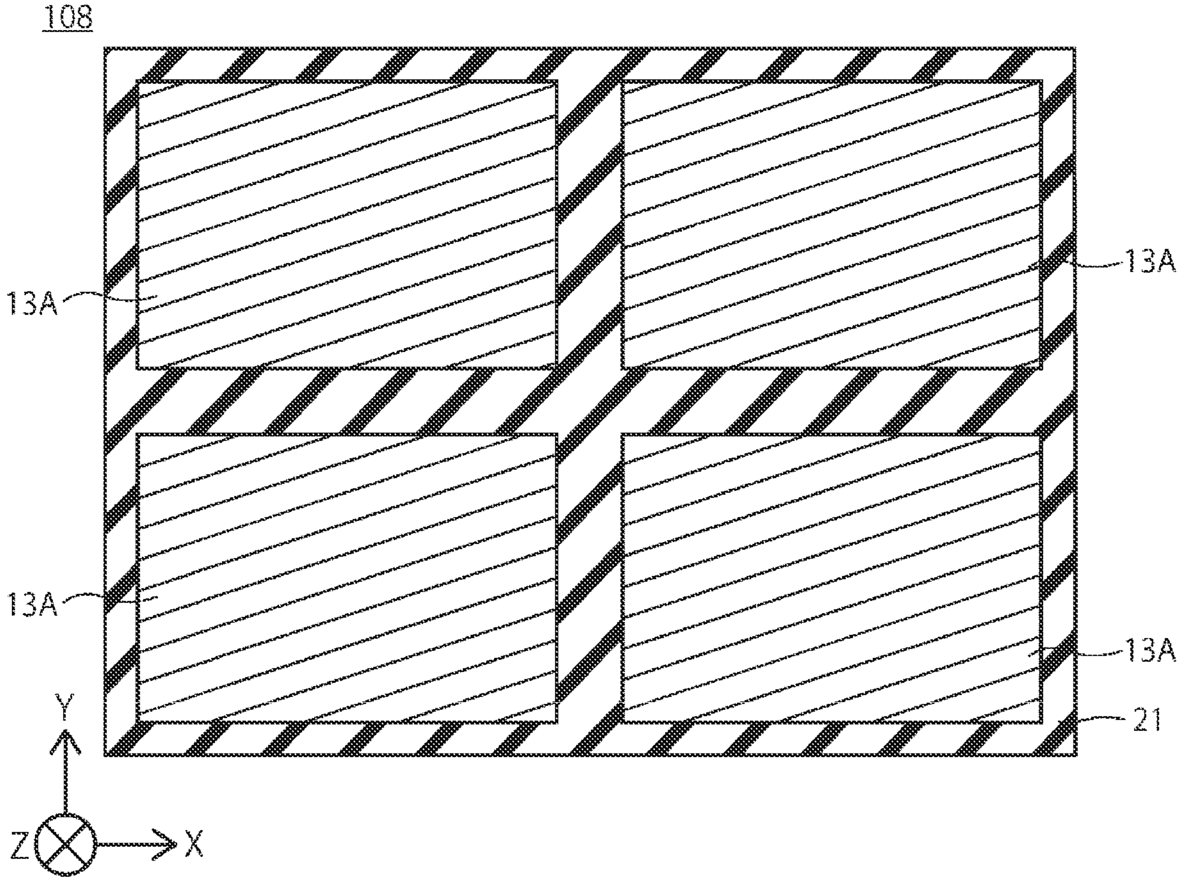
FIG. 17 is a top schematic process diagram of the method of manufacturing a semiconductor device according to one embodiment.
Figure 18:
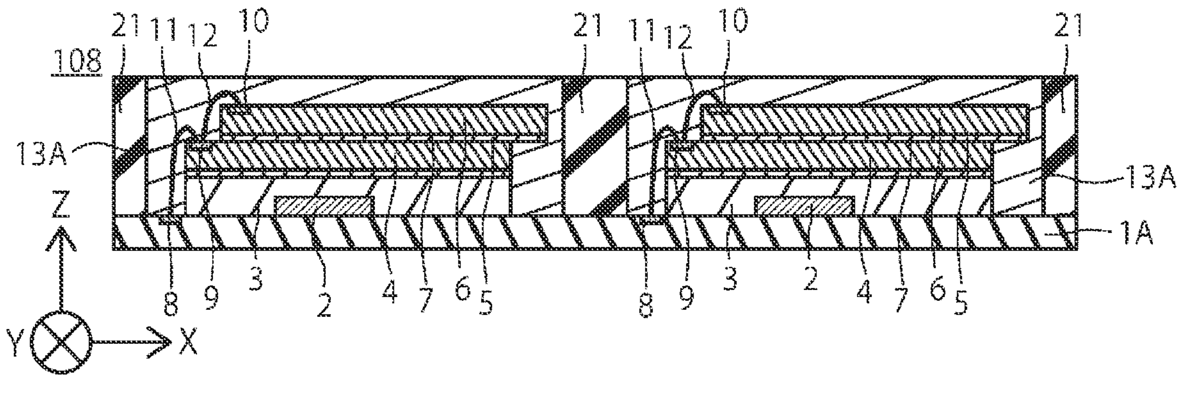
FIG. 18 is a cross-sectional schematic process diagram of the method of manufacturing a semiconductor device according to one embodiment.

Referring to the schematic process diagrams of FIGS. 17 and 18, the step (S13) of putting the liquid second resin precursor 13A into the openings of the second mask 21 will be described. The liquid second resin precursor 13A, which is a precursor of the second resin layers 13, is placed into the openings of the member 107 on which the second mask 21 is put on the wiring board 1A to obtain a member 108. The liquid second resin precursor 13A can be put into the openings of the second mask 21 by direct dropping and/or coating. Screen printing can be used in the application of the liquid second resin precursor 13A. Since the second resin precursor 13A is cured by heating in a state where the second mask 21 is on the wiring board 1A, it is preferable that the second mask 21 is a material having sufficient heat resistance to withstand the curing process. The height of the second mask 21 and the heights of the second resin precursor 13A in the cross-sectional schematic process diagram of FIG. 18 are the same. Preferably, the amount of the second resin precursor 13A in the openings before curing is equal to or less than volume of the openings of the second mask 21.

When the viscosity of the second resin precursor 13A is high, mold-ability is poor, and the surface of the second resin layer 13 after curing may be difficult to flatten. Therefore, preferably, the viscosity of the second resin precursor 13A is between 1 Pa·s and 200 Pa·s at 25° C. More preferably, the viscosity is 100 Pa·s or less, and still more preferably 50 Pa·s or less.

Figure 19:
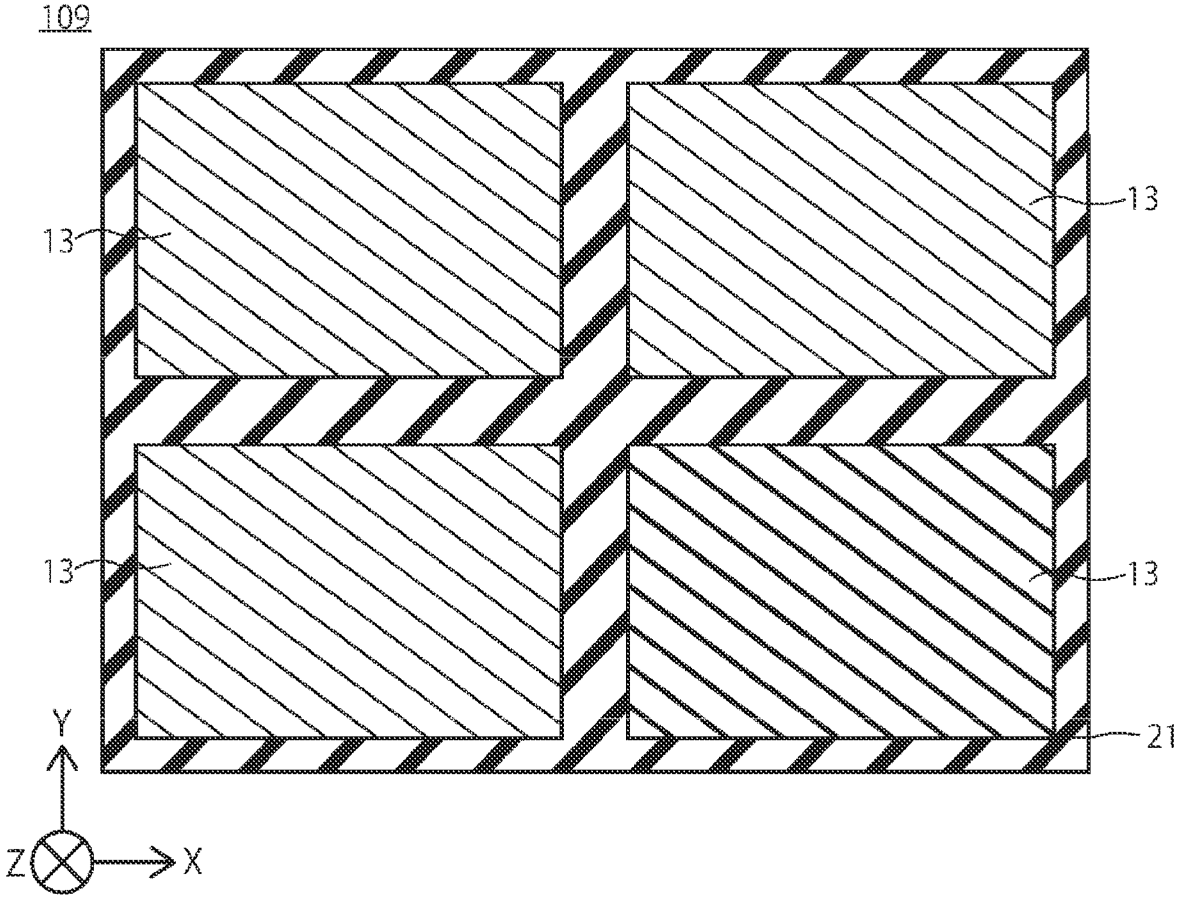
FIG. 19 is a top schematic process diagram of the method of manufacturing a semiconductor device according to one embodiment.
Figure 20:
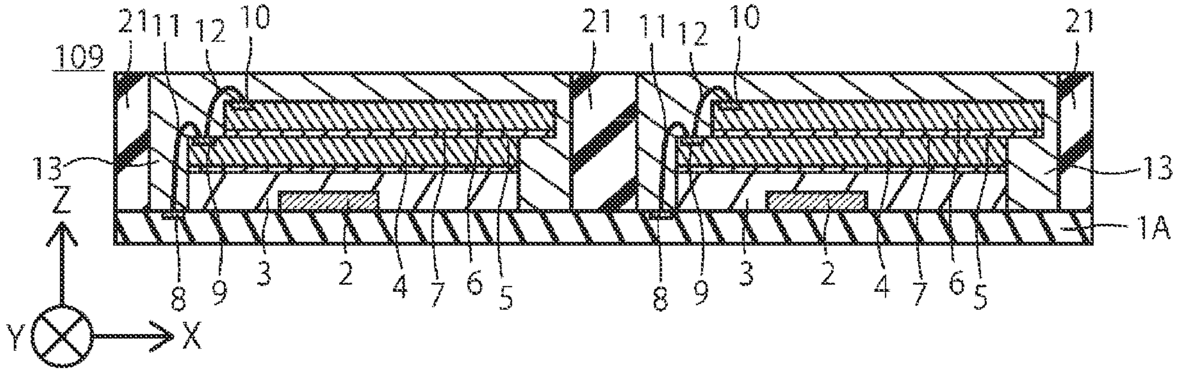
FIG. 20 is a cross-sectional schematic process diagram of the method of manufacturing a semiconductor device according to one embodiment.

Referring to the schematic process diagrams of FIGS. 19 and 20, the step (S14) of curing the second resin precursor 13A to obtain the second resin layers 13 will be described. A member 109 is obtained by curing the second resin precursor 13A with the second mask 21 placed on the wiring board 1A. The second resin precursor 13A is cured by heating, for example. When heating treatment is performed again after this step (S14), the second resin precursor 13A may not yet be completely cured. In this step (S14), when the second resin precursor 13A is not completely cured, the second resin precursor 13A can be further cured when heating treatment is performed in a later step.

Figure 21:
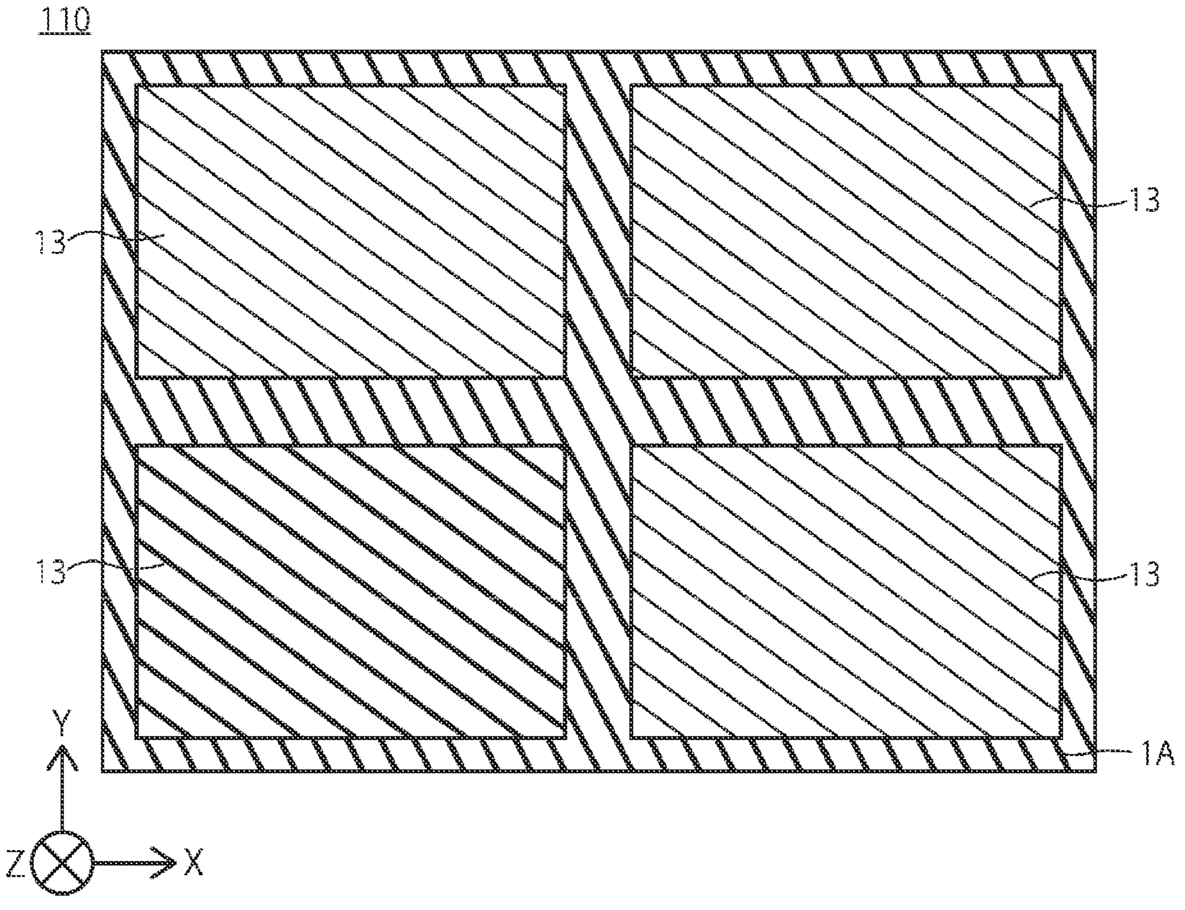
FIG. 21 is a top schematic process diagram of the method of manufacturing a semiconductor device according to one embodiment.
Figure 22:
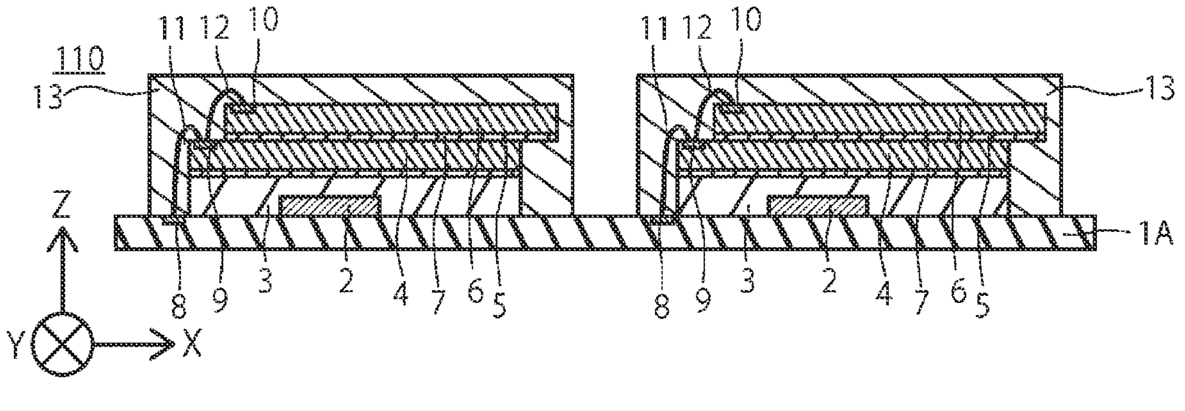
FIG. 22 is a cross-sectional schematic process diagram of the method of manufacturing a semiconductor device according to one embodiment.

Referring to the schematic process diagrams of FIGS. 21 and 22, the step (S15) of removing the second mask 21 will be described. A member 110 is obtained by removing the second mask 21 from the member 109 after the second resin precursor 13A has been cured. By removing the second mask 21 after the curing, a side surface of each second resin layer 13 will be perpendicular or substantially perpendicular to the surface of the wiring board LA.

After the above steps, the semiconductor device 100 may be obtained by fragmenting (e.g., dicing, cutting) the member 110 and forming the solder balls 14.

The flatness of the side surfaces of the first resin layer 3 and the second resin layer 13 is improved by using a mask that is not a pressure mold and has an upper opening. When the flatness of the surface of the first resin layer 3 is high, it is possible to reduce bonding wire formation defects and stress on semiconductor elements such as stacked memory chips.

Second Embodiment

Figure 23:
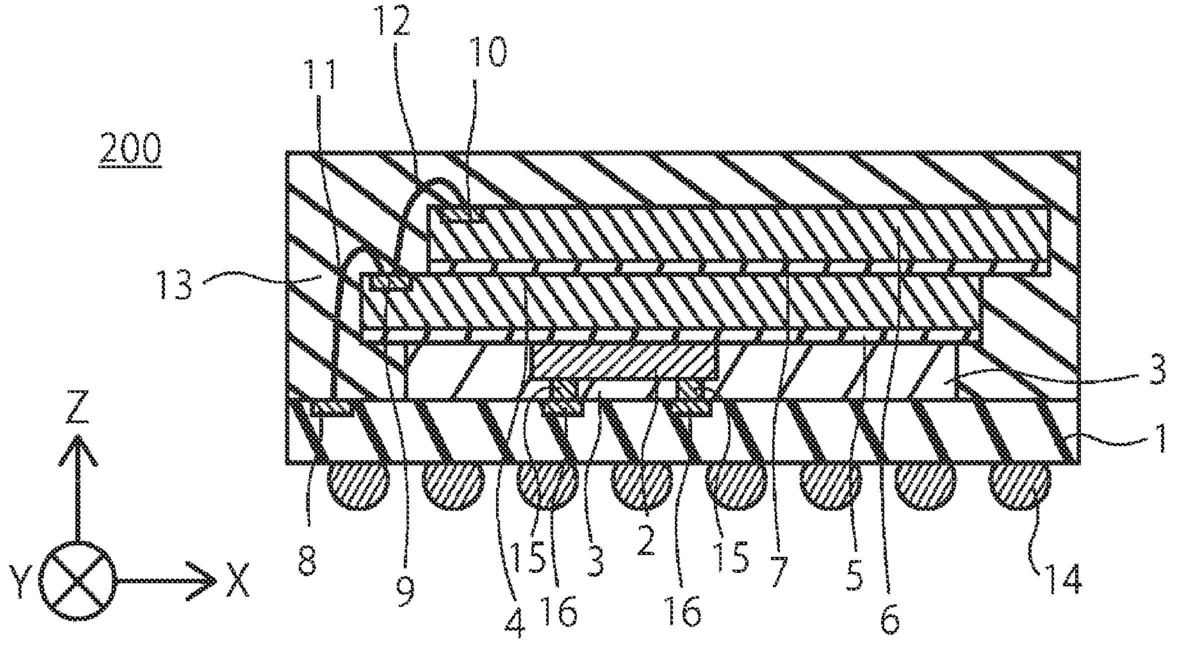
FIG. 23 is a schematic cross-sectional view of a semiconductor device according to one embodiment.

A second embodiment relates to a semiconductor device and a method of manufacturing a semiconductor device. FIG. 23 shows a schematic cross-sectional view of a semiconductor device 200. The semiconductor device 200 of the second embodiment is a modification of the semiconductor device 100 of the first embodiment.

In the semiconductor device 200 of the second embodiment, the first semiconductor element 2 is provided on the wiring board 1 by a flip chip. The semiconductor device 200 of the second embodiment shows pads 16 of the wiring board 1, which are not shown in the semiconductor device 100 of the first embodiment. The first semiconductor element 2 and the pads 16 of the wiring board 1 are connected with a conductive adhesive 15. The first resin layer 3 also serves as an underfill for the first semiconductor element 2, and the first resin layer 3 is also between the first semiconductor element 2 and the wiring board 1. A modification of the second embodiment includes a form in which the first resin layer 3 does not become an underfill. In a form in which the first resin layer 3 does not become the underfill, an underfill is provided between the first semiconductor element 2 and the wiring board 1 before the first resin layer 3 is formed.

An area of a surface of the first resin layer 3 facing the second semiconductor element 4 is smaller than an area of a surface of the second semiconductor element 4 facing the first resin layer 3. Since an upper surface of the first resin layer 3 has high flatness, the second semiconductor element 4 and the third semiconductor element 6 can be stacked with high flatness even when the above area relationship is satisfied.

The method of manufacturing the semiconductor device 200 of the second embodiment is similar to the method of manufacturing the semiconductor device 100 of the first embodiment except that the opening of the first mask 20 is made smaller, the height of the first mask 20 is made smaller, or the amount of the first resin precursor 3A placed into the opening of the first mask 20 is reduced.

By changing the shape of the first mask 20 including the opening, the shape of the first resin layer 3 can be changed. The flatness of the side surfaces of the first resin layer 3 and the second resin layer 13 is also improved by the method of manufacturing a semiconductor device 200 of the second embodiment. When the flatness of the surface of the first resin layer 3 is high, it is possible to reduce bonding wire formation defects and stress on semiconductor elements such as stacked memory chips.

Third Embodiment

Figure 24:
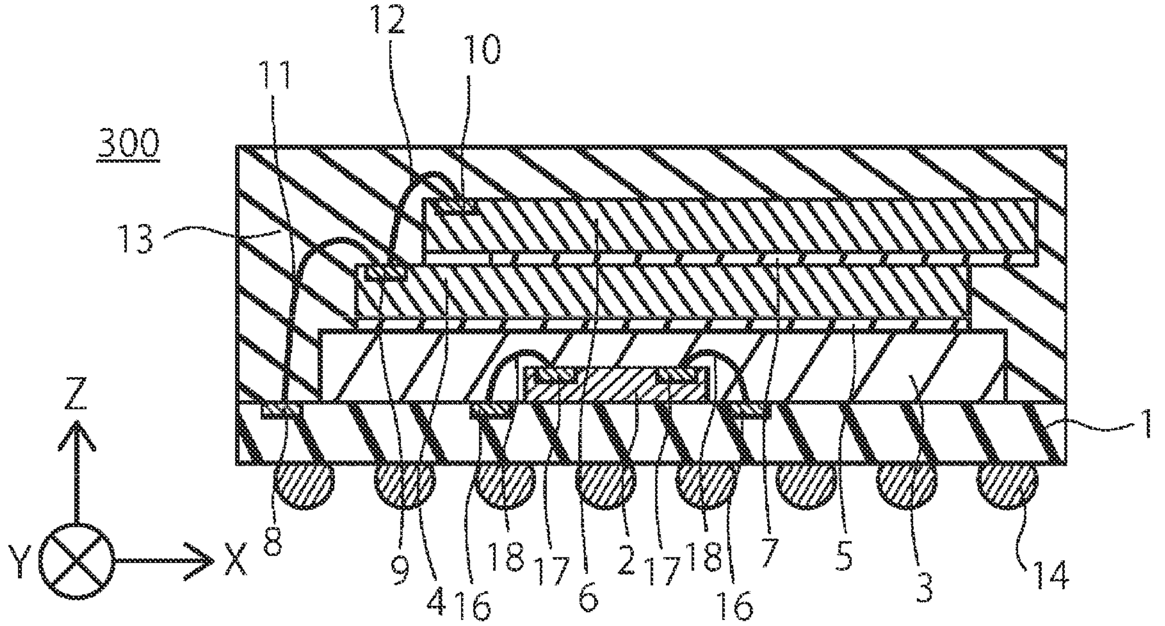
FIG. 24 is a schematic cross-sectional view of a semiconductor device according to one embodiment.

A third embodiment relates to a semiconductor device and a method of manufacturing a semiconductor device. FIG. 24 shows a schematic cross-sectional view of a semiconductor device 300. The semiconductor device 300 of the third embodiment is a modification of the semiconductor device 100 of the first embodiment.

The first semiconductor element 2 of the semiconductor device 300 is connected to the wiring board 1 by bonding wires 18. The first semiconductor element 2 is, for example, a bare chip. The first semiconductor element 2 is provided on the wiring board 1. The pads 16 of the wiring board 1 and pads 17 of the first semiconductor element 2 are connected by the bonding wires 18. The bonding wires 18 are also sealed with the first resin layer 3.

An area of a surface of the first resin layer 3 facing the second semiconductor element 4 is larger than an area of a surface of the second semiconductor element 4 facing the first resin layer 3. Even when the first resin layer 3 is large, the flatness of the side surface is good, so that bonding wire formation defects can be prevented.

By changing the shape of the first mask 20 including the opening, the shape of the first resin layer 3 can be changed. The flatness of the side surfaces of the first resin layer 3 and the second resin layer 13 is also improved by the method of manufacturing a semiconductor device 300 of the third embodiment. When the flatness of the surface of the first resin layer 3 is high, it is possible to reduce bonding wire formation defects and stress on semiconductor elements such as stacked memory chips, thereby contributing to an improvement in yield.

Fourth Embodiment

Figure 25:
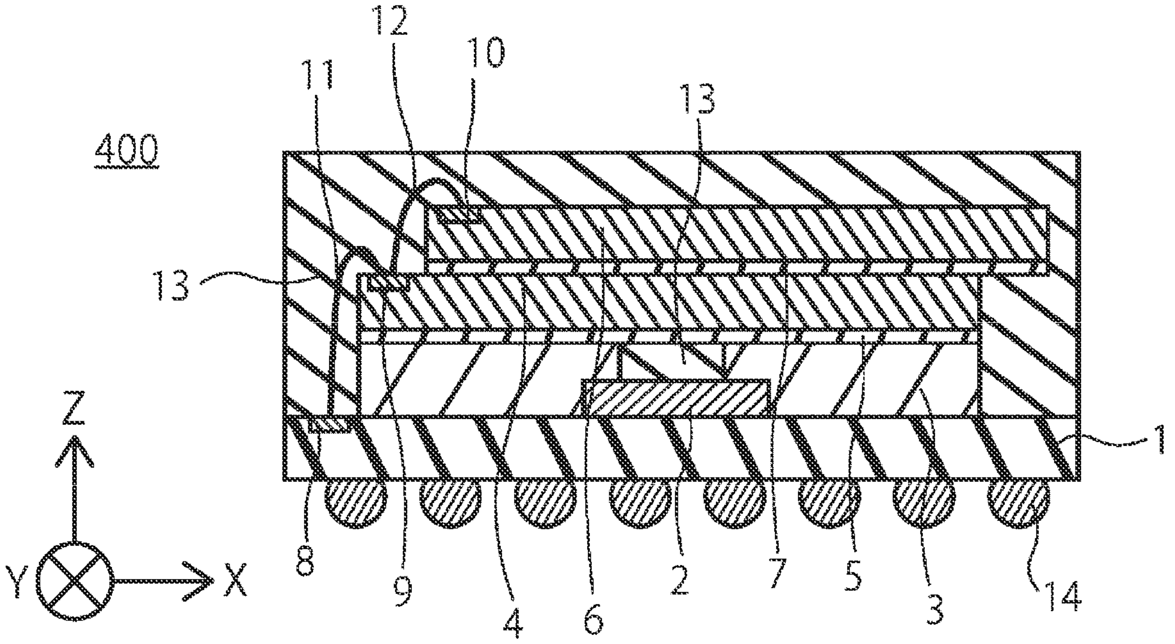
FIG. 25 is a schematic cross-sectional view of a semiconductor device according to one embodiment.

A fourth embodiment relates to a semiconductor device and a method of manufacturing a semiconductor device. FIG. 25 shows a schematic cross-sectional view of a semiconductor device 400. The semiconductor device 400 of the fourth embodiment is a modification of the semiconductor device 100 of the first embodiment.

The semiconductor device 400 has a gap above a part of the first semiconductor element 2 in which the first resin layer 3 is not provided. The second resin layer 13 is partially or wholly provided in the gap where the first resin layer 3 is not provided. The gap where the first resin layer 3 is omitted is not limited to a position above the first semiconductor element 2 and may be located anywhere deemed appropriate.

Figure 26:
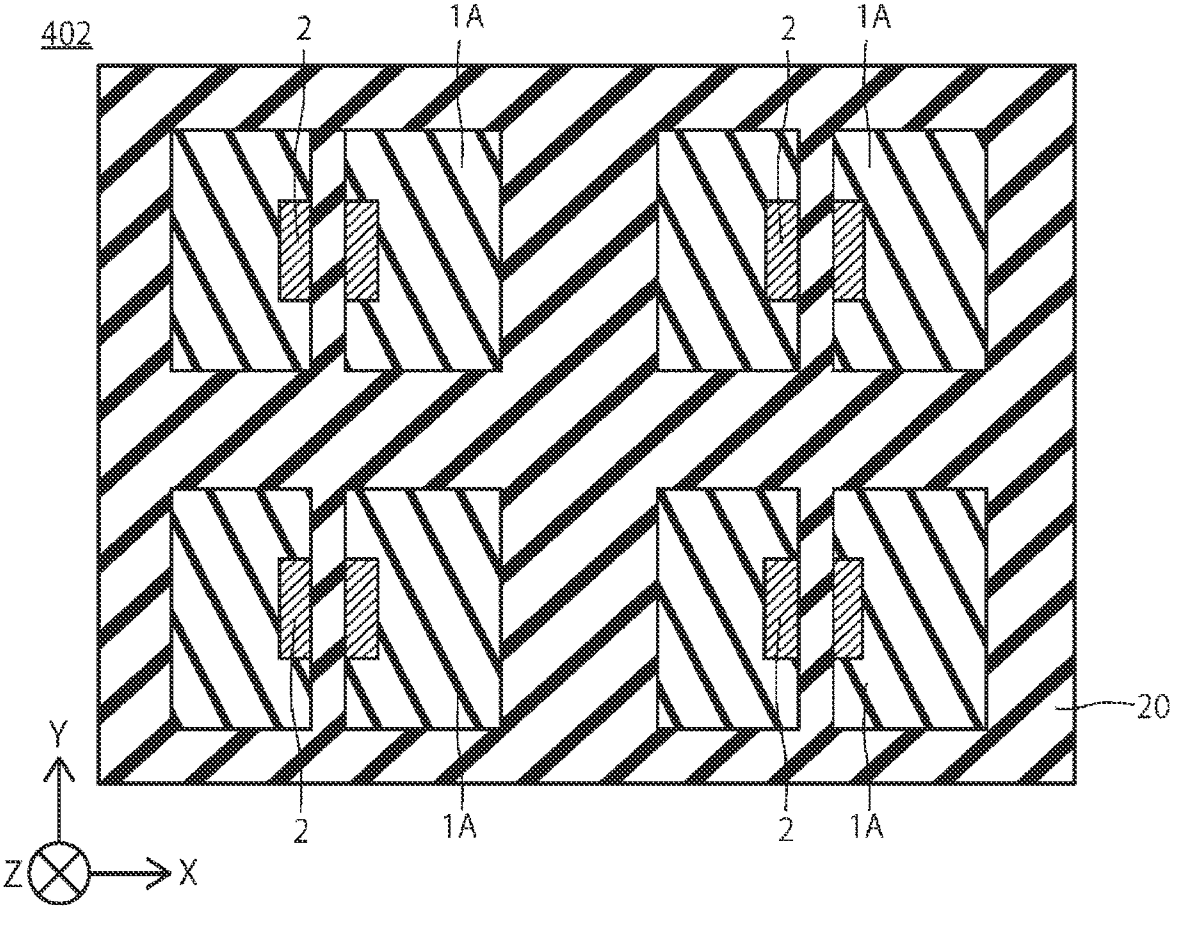
FIG. 26 is a top schematic process diagram of the method of manufacturing a semiconductor device according to one embodiment.
Figure 27:
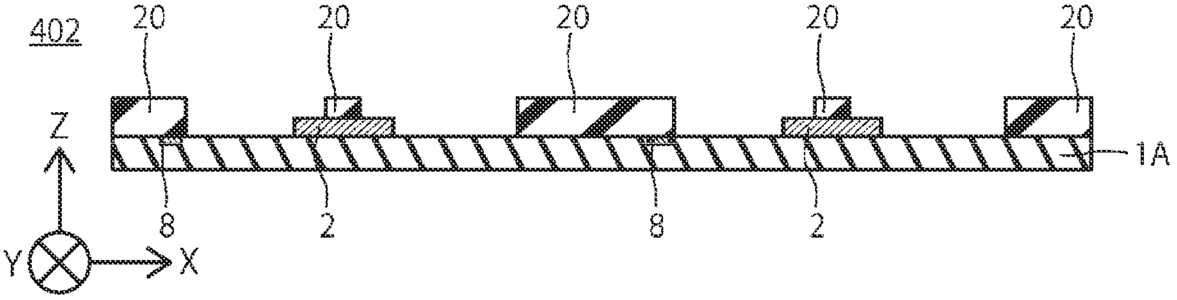
FIG. 27 is a cross-sectional schematic process diagram of the method of manufacturing a semiconductor device according to one embodiment.

The gap on the first semiconductor element 2 is formed by adopting, for example, an opening with a bridge structure in the first mask 20. FIG. 26 shows a top schematic process diagram of the semiconductor device 400 in manufacturing. FIG. 27 shows a schematic cross-sectional process diagram of the semiconductor device 400 in manufacturing. The schematic process diagrams of FIGS. 26 and 27 show a member 402 corresponding to the step (S02) of using the first mask 20. Although the first mask 20 shown in the schematic process diagrams of FIGS. 4 and 5 does not have the bridge in the opening, the first mask 20 shown in the schematic process diagrams of FIGS. 26 and 27 have a bridge structure spanning across the openings at a position above the semiconductor elements 2. The bridge structure can be made up of the same material as the other portions of the first mask 20, The bridge structure rests in part on a portion of the first semiconductor element and leaves the gap where the first resin layer 3 is not formed. The second resin layer 13 is subsequently formed in the gap by filling the gap with the second resin precursor 13A. When the second resin precursor 13A fills the entire gap, the second resin layer 13 is formed over the entire gap. When a region where the second resin precursor 13A does not enter is provided in a portion of this gap, a semiconductor device 400 in which the second resin layer 13 does not exist in a portion of the gap is obtained.

By changing the shape of the first mask 20, the shape of the first resin layer 3 can be correspondingly changed. The flatness of the side surfaces of the first resin layer 3 and the second resin layer 13 is also improved by the method of manufacturing a semiconductor device 400 of the fourth embodiment. When the flatness of the surface of the first resin layer 3 is high, it is possible to reduce bonding wire formation defects and stress on semiconductor elements such as stacked memory chips, thereby contributing to an improvement in yield.

Fifth Embodiment

Figure 28:
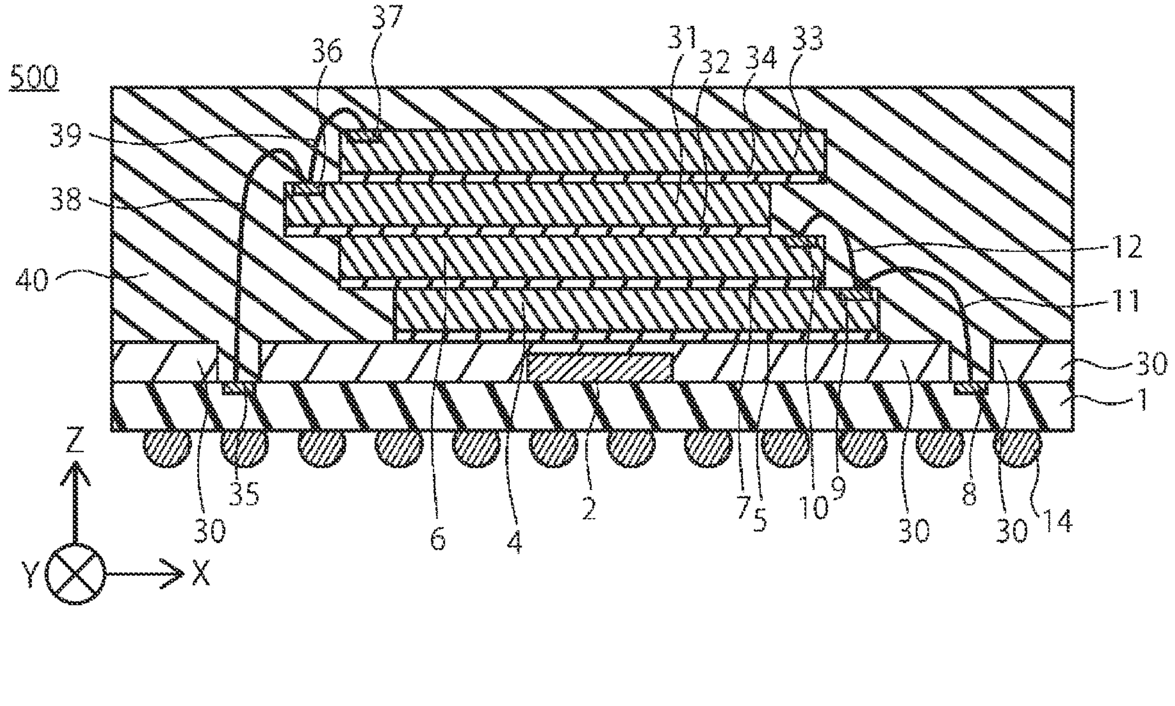
FIG. 28 is a schematic cross-sectional view of a semiconductor device according to one embodiment.

The fifth embodiment relates to a semiconductor device and a method of manufacturing a semiconductor device. FIG. 28 shows a schematic cross-sectional view of a semiconductor device 500.

The semiconductor device 500 is an example of a memory device. The semiconductor device 500 includes the wiring board 1, the first semiconductor element 2, the third resin layer 30, the second semiconductor element 4, the first intermediate layer 5, the third semiconductor element 6, the second intermediate layer 7, the pad 8, the pad 9, the pad 10, the bonding wire 11, the bonding wire 12, a fourth semiconductor element 31, a third intermediate layer 32, a fifth semiconductor element 33, a fourth intermediate layer 34, a pad 35, a pad 36, a pad 37, a bonding wire 38, a bonding wire 39, a fourth resin layer 40, and the solder balls 14.

The wiring board 1 has a pad 8 that connects the second semiconductor element 4 and the third semiconductor element 6 and a pad 35 that connects the fourth semiconductor element 31 and the fifth semiconductor element 33. The first semiconductor element 2 is placed on the wiring board 1. The third resin layer 30 is provided on the wiring board.

The first semiconductor element 2 is electrically connected to the second semiconductor element 4, the third semiconductor element 6, the fourth semiconductor element 31, and the fifth semiconductor element 33 through the wiring board 1.

The third resin layer 30 comprises a third resin alone or a third resin and a third filler. The third resin layer 30 is insulating. The third resin layer 30 is provided on the wiring board 1. The third resin layer 30 is provided outside the first semiconductor element 2. Preferably, the third resin layer 30 is in direct contact with the side surface of the first semiconductor element 2. Preferably, the third resin layer 30 seals the first semiconductor element 2. More specifically, the third resin layer 30 seals the wiring member(s) that connects the first semiconductor element 2 and the wiring board 1 as well as the first semiconductor element 2, but does not seal the bonding wire 11, the bonding wire 12, the bonding wire 38, the bonding wires 39, the second semiconductor element 4, the third semiconductor element 6, the fourth semiconductor element 31, and the fifth semiconductor element 33. When an underfill is used between the first semiconductor element 2 and the wiring board 1, the third resin layer 30 seals the underfill, the wiring member connecting the first semiconductor element 2 and the wiring board 1, and the first semiconductor element 2. The third resin layer 30 shown in the schematic diagram of FIG. 28 seals the first semiconductor element 2. The third resin layer 30 is a material formed by curing a third resin precursor 30A of the third resin with light, preferably ultraviolet light (light containing a wavelength between 320 nm and 400 nm).

Preferably, the third resin comprises one or more materials (as mixtures and/or copolymers) selected from the group consisting of a polyimide resin, a polyamideimide resin, a polyamide resin, a polyimide silicone resin, an epoxy resin, a phenol resin, a polyimide resin, a polyamide resin, an acrylic resin, a polybenzoxazole resin, a silicone resin, and a benzocyclobutene resin. More preferably, the third resin comprises one or more materials selected from the group consisting of a polyimide resin, a polyamideimide resin, a polyamide resin, and a polyimide silicone resin.

Preferably, the third resin layer 30 is a resin obtained by curing the photosensitive third resin precursor 30A which changes from liquid to solid upon exposure to light. The third resin precursor 30A can be precursor of one or more resins selected from the group consisting of a polyimide resin, a polyamideimide resin, a polyamide resin, a polyimide silicone resin, an epoxy resin, a phenol resin, a polyimide resin, a polyamide resin, an acrylic resin, a polybenzoxazole resin, a silicone resin, and a benzocyclobutene resin. Preferably, the third resin precursor 30A includes one or more precursors selected from the group consisting of a polyimide resin, a polyamideimide resin, a polyamide resin, and a polyimide silicone resin. The third resin precursor 30A may also contain a photoacid generator or the like in addition to the resin precursor material(s).

Preferably, the side surface of the third resin layer 30 is perpendicular or substantially perpendicular to the surface of the wiring board 1. Preferably, an angle of the side surface of the third resin layer 30 with respect to the surface of the wiring board 1 is between 85° and 95°. The angle of the side surface of the third resin layer 30 is determined similarly to the angle of the side surface of the first resin layer 3.

The fourth semiconductor element 31 is placed on the third semiconductor element 6 via the third intermediate layer 32, for example. The fifth semiconductor element 33 is placed on the fourth semiconductor element 31 via the fourth intermediate layer 34, for example. The fourth semiconductor element 31 and the fifth semiconductor element 33 are, for example, semiconductor memory chips. The third intermediate layer 32 is, for example, an adhesive layer of DAF. The fourth intermediate layer 34 is, for example, an adhesive layer of DAF.

When the semiconductor device 500 is a memory device, preferably, the fourth semiconductor element 31 and the fifth semiconductor element 33 are semiconductor chips with the same structure having the same circuit as the second semiconductor element 4 except for individual differences.

The pad 35 of the wiring board 1 and the pad 36 of the fourth semiconductor element 31 are connected by the bonding wire 38 to electrically connect the fourth semiconductor element 31 and the wiring board 1. The pad 37 of the fifth semiconductor element 33 and the pad 36 of the fourth semiconductor element 31 are connected by the bonding wire 39 to electrically connect the fifth semiconductor element 33 to the fourth semiconductor element 31 and the wiring board 1.

In the semiconductor device 500 shown in FIG. 28, the second semiconductor element 4 and the third semiconductor element 6 are stacked while being shifted in the −X (minus X) direction. In addition, the fourth semiconductor element 31 and the fifth semiconductor element 33 are stacked while being shifted in the +X direction. The pad 35 is provided on the wiring board 1 when the stacking direction is changed. When the fourth semiconductor element 31 and the fifth semiconductor element 33 are omitted, the pad 35 is omitted. When the fourth semiconductor element 31 and the fifth semiconductor element 33 are also stacked in the −X direction, the pad 35 can be omitted, and preferably, the bonding wire connecting between the third semiconductor element 6 and the fourth semiconductor element 31 is formed.

The fourth resin layer 40 seals the first resin layer 3, the second semiconductor element 4, the third semiconductor element 6, the fourth semiconductor element 31, the fifth semiconductor element 33, the bonding wires 11, the bonding wires 12, the bonding wires 38, and the bonding wire 39. When the first semiconductor element 2 is not sealed with the third resin layer 30, the first semiconductor element 2 is sealed with the fourth resin layer 40. The fourth resin layer 40 is the same as the second resin layer 13. The fourth resin layer 40 is, for example, an insulating layer cured by heat.

Next, a method of manufacturing the semiconductor device 500 will be described. Although the method of manufacturing a semiconductor device 500 is exemplified in the specification, other methods may be adopted for a method of forming the third resin layer 30 and a method of forming the fourth resin layer 40, for example. FIG. 29 shows a flow chart of the method of manufacturing the semiconductor device 500. FIGS. 30 to 36 show schematic process diagrams of the semiconductor device 500. In the process diagrams, the reference numerals of some members may be omitted. In the method of manufacturing the semiconductor device 500, although an example of manufacturing one chip of the semiconductor device 500 is shown, a plurality of semiconductor devices 500 can be manufactured by using the wiring board 1A and performing fragment as in the first embodiment.

The method of manufacturing a semiconductor device 500 includes a step (S21) of placing the first semiconductor elements 2 on the wiring board 1 having a pad 8, a step (S22) of applying the third resin precursor 30A onto the wiring board 1 and the first semiconductor element 2, a step (S23) of forming the third resin layer 30 by irradiating the third resin precursor 30A with light to cure the third resin precursor 30A, a step (S24) of opening (e.g., patterning) the third resin layer 30 above the pad 8, a step (S25) of placing the second semiconductor element 4 on the third resin layer 30, a step (S26) of forming the bonding wire 11 that connects the pad 9 of the second semiconductor element 4 to the pad 8 of the wiring board 1, and a step (S27) of forming the fourth resin layer 40 that seals (covers) the third resin layer 30 and the second semiconductor element 4.

Referring to the schematic process diagram of FIG. 30, the step (S21) of placing the first semiconductor element 2 on the wiring board 1 will be described. The schematic process diagram of FIG. 30 shows a member 501 in which the first semiconductor element 2 has been placed on the wiring board 1 having pads 8. The member 501 is obtained by putting the first semiconductor element 2 on the wiring board 1 and electrically connecting the wiring board 1 and the first semiconductor element 2. When the first semiconductor element 2 is a flip chip, the first semiconductor element 2 is positioned on a region where a corresponding pad on the wiring board 1 is located. A conductive adhesive and a pad are present on a back surface side of the first semiconductor element 2. The first semiconductor element 2 and the wiring board 1 are connected via the conductive adhesive between the back surface side of the first semiconductor element 2 and corresponding pad (or pads) on the upper surface of the wiring board 1.

Figure 31:
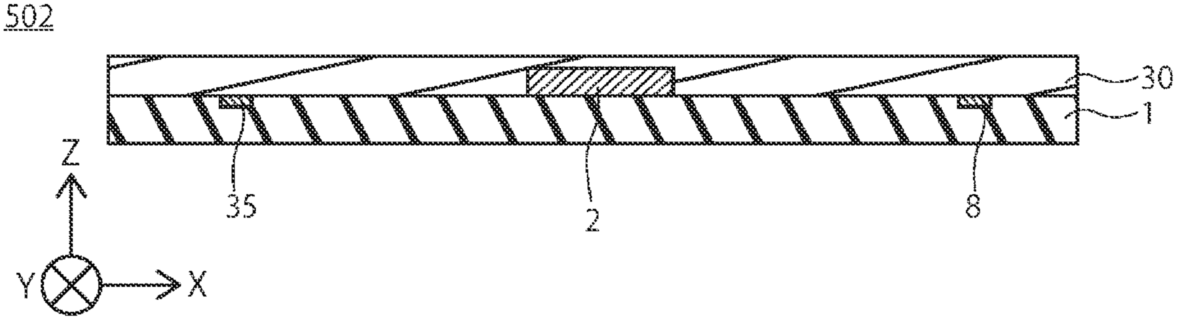
FIG. 31 is a schematic process diagram of the method of manufacturing a semiconductor device according to one embodiment.

Referring to the schematic process diagram of FIG. 31, the step (S22) of applying the third resin precursor 30A onto the wiring board 1 and the first semiconductor element 2 will be described. As shown in the schematic process diagram of FIG. 31, a member 502 is obtained by applying the third resin precursor 30A onto the entire wiring board 1 of the member 501. Preferably, a thickness of the third resin precursor 30A to be applied is equal to or greater than a distance from the surface of the wiring board 1 to the upper surface of the first semiconductor element 2. The third resin precursor 30A is liquid and can be applied by spin coating, for example. Preferably, after being applied by spin coating or the like, the thickness of the third resin precursor 30A is uniform and the surface of the third resin precursor 30A is flat. The third resin precursor 30A is also applied over the pad 8 and pad 35 of the wiring board 1.

In a variation of the method of manufacturing the semiconductor device 100, a semiconductor device 100 can be manufactured by forming the first resin layer 3 to cover a pad 8 on the wiring board 1A and then opening (patterning) the first resin layer 3 above the pad 8 in a similar manner as for the method of manufacturing a semiconductor device 500.

Figure 32:
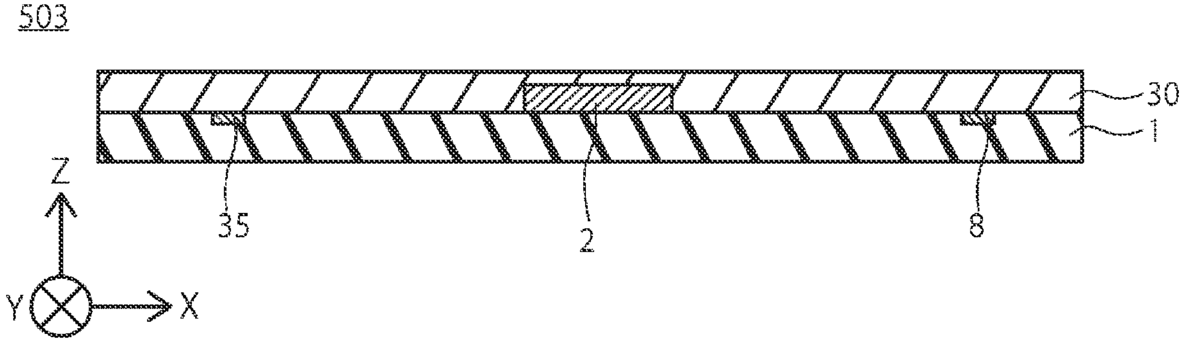
FIG. 32 is a schematic process diagram of the method of manufacturing a semiconductor device according to one embodiment.

Referring to the schematic process diagram of FIG. 32, the step (S23) of forming the third resin layer 30 by irradiating the third resin precursor 30A with light to cure the third resin precursor 30A will be described. The surface of the member 502 facing the third resin precursor 30A side is irradiated with light containing ultraviolet rays. Since the third resin precursor 30A is a photosensitive resin composition that changes from liquid to solid when irradiated with ultraviolet rays, the third resin precursor 30A can be cured by irradiation with ultraviolet rays. A member 503 in which the third resin layer 30 is now provided on the wiring board 1 is obtained by curing the third resin precursor 30A. The third resin layer 30 is also on the pad 8 and pad 35 at this time.

Preferably, the light with which the third resin precursor 30A is irradiated is ultraviolet rays with a wavelength between 320 nm and 400 nm. An irradiation intensity and an irradiation time of the ultraviolet rays are not particularly limited.

Figure 33:
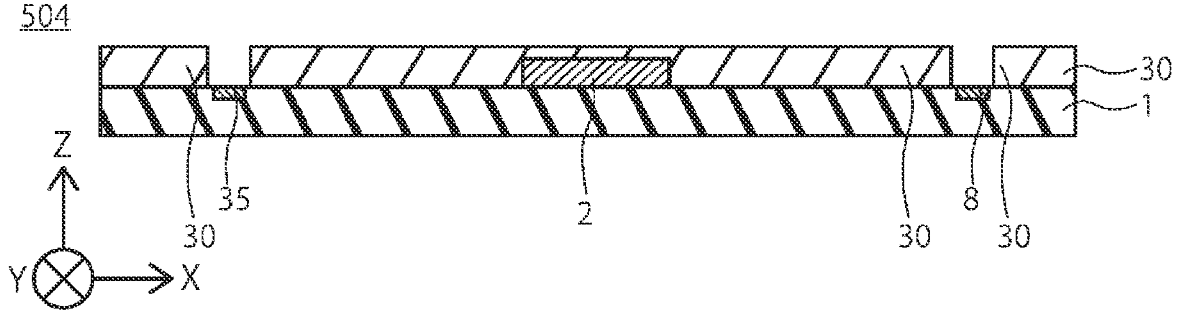
FIG. 33 is a schematic process diagram of the method of manufacturing a semiconductor device according to one embodiment.

Referring to the schematic process diagram of FIG. 33, the step (S24) of opening the third resin layer 30 on the pad 8 will be described. For example, a photomask and photolithography is used for forming openings above the pad 8 and pad 35 of the member 503 and etching through resist mask or the like is performed to open the third resin layer 30 above the pad 8 and pad 35 to obtain member 504. Portions of the third resin layer 30 other than just those above the pad 8 and pad 35 can also be removed by this processing. When other passive elements or active elements are to be provided on the wiring board 1, then, in the step (S24), the portions of the third resin layer 30 where other elements are to be provided can also be removed in the same processing.

Figure 34:
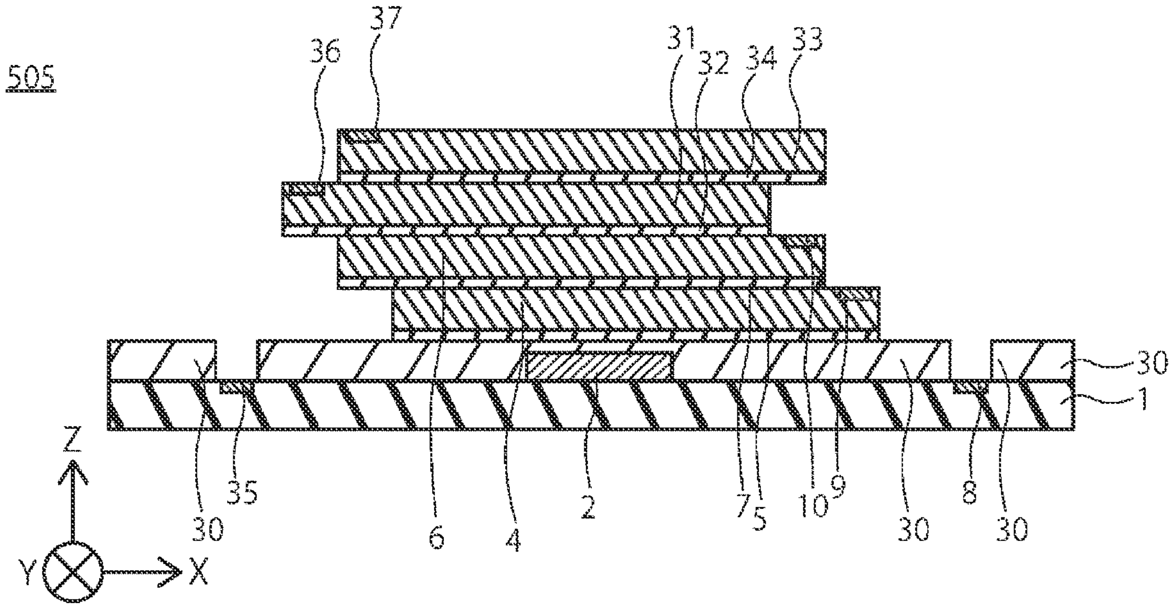
FIG. 34 is a schematic process diagram of the method of manufacturing a semiconductor device according to one embodiment.

Referring to the schematic process diagram of FIG. 34, the step (S25) of placing the second semiconductor element 4 on the third resin layer 30 will be described. The second semiconductor element 4 is placed on the third resin layer 30 of the member 504. When desiring a semiconductor device having a third semiconductor element 6, a fourth semiconductor element 31, and a fifth semiconductor element 33 above the second semiconductor element 4 (like the semiconductor device 100 of FIG. 1), the member 505 is obtained by placing the fourth semiconductor element 31 and the fifth semiconductor element 33 on the third semiconductor device 6 as depicted and explained. The second semiconductor element 4 and the first intermediate layer 5 are stacked on the third resin layer 30, and the second semiconductor element 4 is adhered to the third resin layer 30. The semiconductor element 6 and the second intermediate layer 7 are stacked on the second semiconductor element 4, and the third semiconductor element 6 is adhered to the second semiconductor element 4. The fourth semiconductor element 31, and the third intermediate layer 32 are stacked on the third semiconductor element 6 and the fourth semiconductor element 31 is adhered to the third semiconductor element 6. The fifth semiconductor element 33 and the fourth intermediate layer 34 are stacked on the fourth semiconductor element 31, and the fifth semiconductor element 33 is adhered to the fourth semiconductor element 31.

Figure 35:
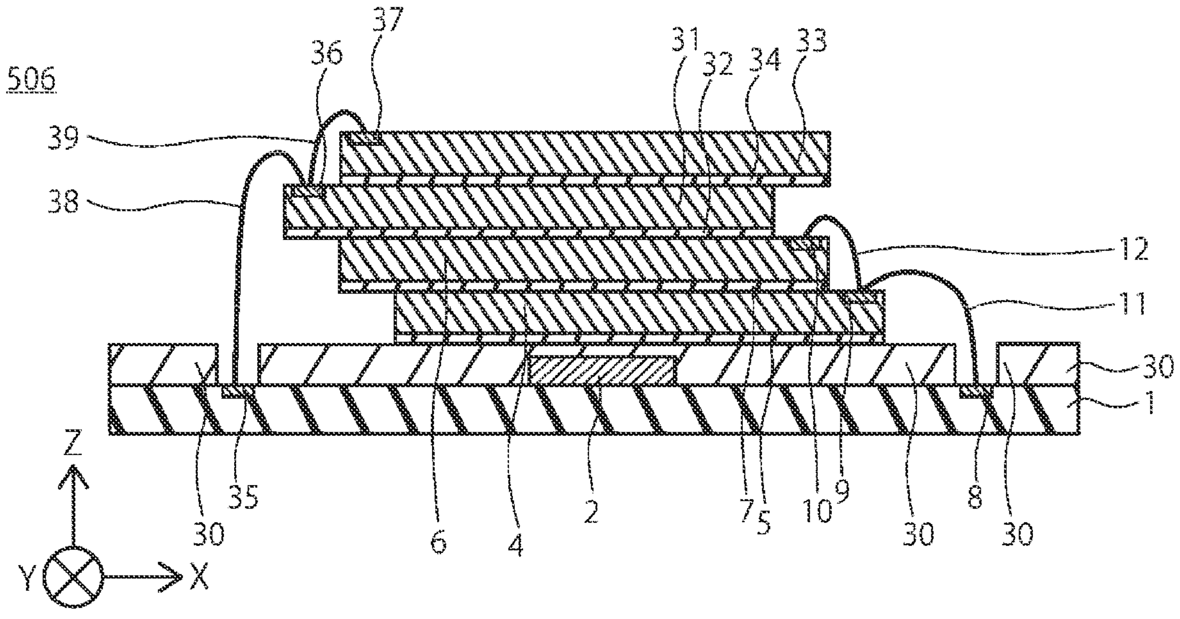
FIG. 35 is a schematic process diagram of the method of manufacturing a semiconductor device according to one embodiment.

Referring to the schematic process diagram of FIG. 35, the step (S24) of forming the bonding wire 11 connecting the pad 9 and the pad 8 will be described. The pad 8 of the wiring board 1 of the member 505 is open, and the bonding wire 11 connecting the second semiconductor element 4 and the pad 8 is formed. When the semiconductor device 500 has the third semiconductor element 6, the fourth semiconductor element 31 and the fifth semiconductor element 33, the bonding wire 12, bonding wire 38, and bonding wire 39 are similarly formed. In some examples, after placing the second semiconductor element 4 and the third semiconductor element 6 and forming the bonding wire 11 and the bonding wire 12, the fourth semiconductor element 31 and the fifth semiconductor element 33 may be placed and the bonding wire 38 and the bonding wire 39 may be formed. A member 506 is obtained by forming the bonding wires 11 and the like.

Figure 36:
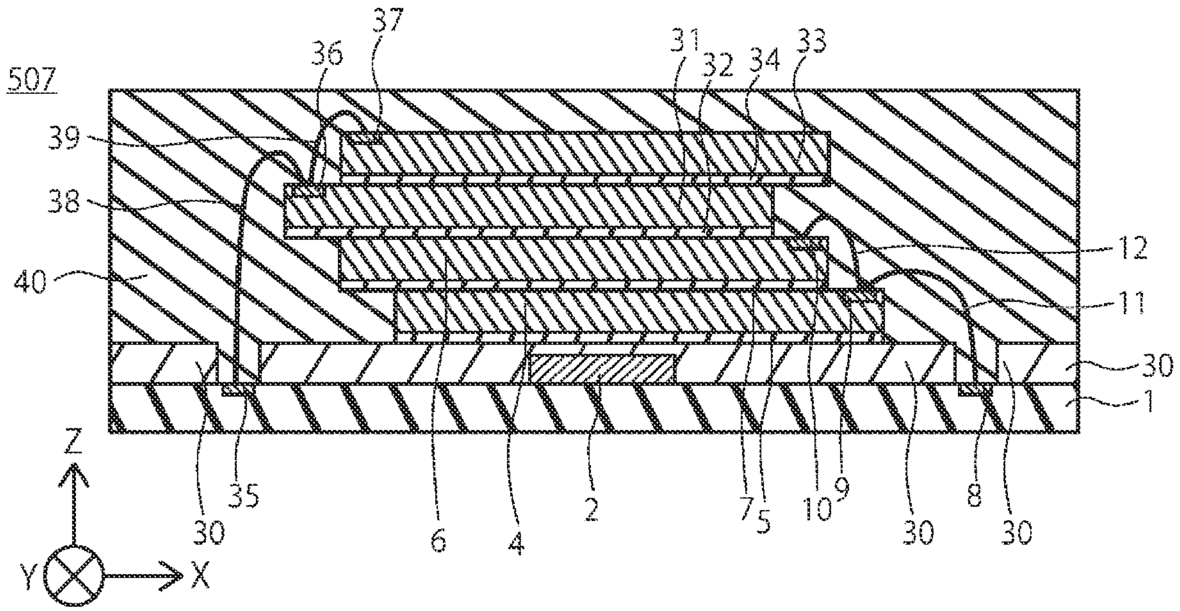
FIG. 36 is a schematic process diagram of the method of manufacturing a semiconductor device according to one embodiment.

Referring to the schematic process diagram of FIG. 36, the step (S27) of forming the fourth resin layer 40 that seals the third resin layer 30 and the second semiconductor element 4 will be described. A member 507 is obtained by providing a resin composition (precursor) of the fourth resin layer 40 on the member 506 and then molding and curing the resin composition to form the fourth resin layer 40.

After the above steps, the semiconductor device 500 can be obtained by fragmenting (e.g., dicing or cutting) the members 507 from a larger substrate and forming the solder balls 14 as necessary.

When a portion of the third resin layer 30 is removed by anisotropic etching, the side surface of the third resin layer 30 becomes perpendicular or substantially perpendicular to the surface of the wiring board 1. When the flatness of the side surface of the third resin layer 30 is high, bonding wire formation defects can be prevented, thereby contributing to an improvement in device yield.

The flatness of the upper surface of the third resin layer 30 obtained by curing third resin precursor 30A can be improved as compared to other formation techniques, and the second semiconductor element 4 can thus be placed on the third resin layer 30 having high flatness without requiring a use of a plate-like member. Further, since the third resin layer 30 has high flatness, a thin first intermediate layer 5 can be used. When the flatness of the third resin layer 30 is high, the stress applied to the second semiconductor element 4 can be reduced. Furthermore, when stacking many semiconductor elements, the influence of the flatness of the third resin layer 30 increases as the number of semiconductor elements to be stacked increases. When the flatness of the third resin layer 30 is poor, the semiconductor elements may be stacked with a large tilt. When the flatness of the third resin layer 30 is high, the semiconductor element can be stacked without being significantly tilted. When multiple semiconductor elements are stacked at a tilted angle, the height becomes higher than when the same number of semiconductor elements are stacked without any tilt. Thus, a tilted stack of semiconductor elements may result in package height increases. The flatness of the third resin layer 30 thus contributes to reducing the height of the package in addition to eliminating the plate-like member.

Sixth Embodiment

Figure 37:
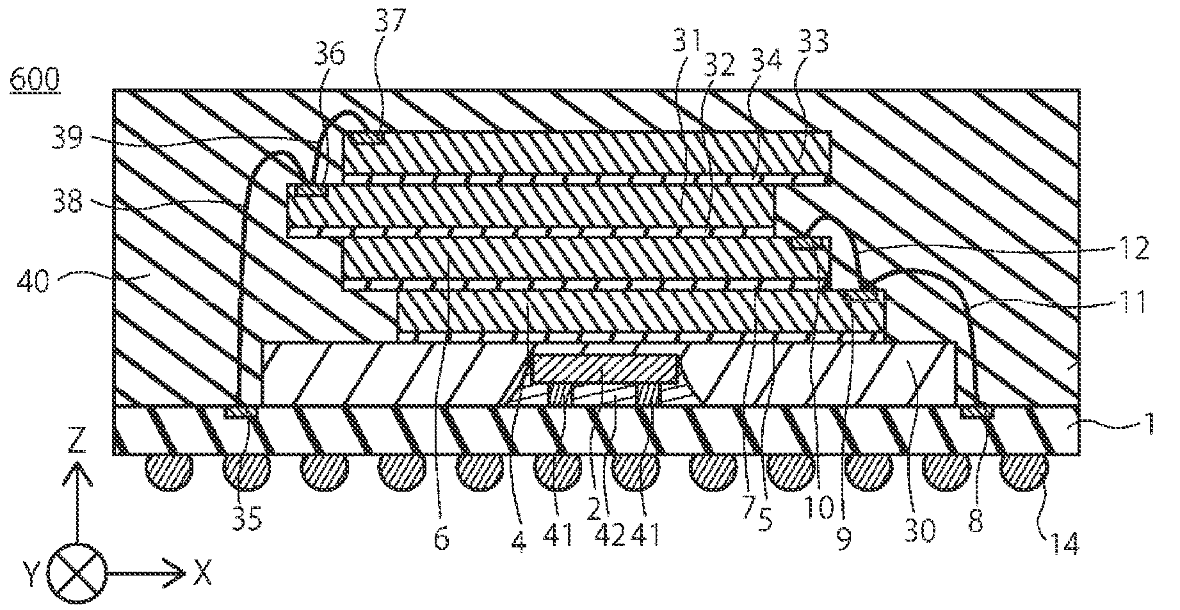
FIG. 37 is a schematic cross-sectional view of a semiconductor device according to one embodiment.

A sixth embodiment relates to a semiconductor device and a method of manufacturing a semiconductor device. FIG. 37 shows a schematic cross-sectional view of a semiconductor device 600. The semiconductor device 600 of the sixth embodiment is a modification of the semiconductor device 500 of the fifth embodiment.

In the semiconductor device 600 of the sixth embodiment, the first semiconductor element 2 is a flip chip. The first semiconductor element 2 is electrically connected to a pad of the wiring board 1 via a conductive adhesive 41. In the semiconductor device 600, the first semiconductor element 2 is placed on the wiring board 1 using underfill, and an underfill 42 is formed on the bottom and side surfaces of the first semiconductor element 2.

The third resin layer 30 of the semiconductor device 600 is not provided on the wiring board 1 beyond the bonding wire 11 and the bonding wire 38. In the step (S24) of opening the third resin layer 30 for the pad 8 the third resin layer 30 beyond the bonding wire 11 and the bonding wire 38 is removed, the semiconductor device 600 having the third resin layer 30 only in a region inside (between) the pad 8 and the pad 35 is obtained.

By changing the shape of the mask for processing the third resin layer 30, the shape of the third resin layer 30 can be varied. The method of manufacturing a semiconductor device 600 of the sixth embodiment also increases the flatness of the side surfaces of the third resin layer 30. When the flatness of the surface of the third resin layer 30 is high, it is possible to reduce bonding wire formation defects and stress on semiconductor elements such as stacked memory chips, thereby contributing to an improvement in yield.

Seventh Embodiment

Figure 38:
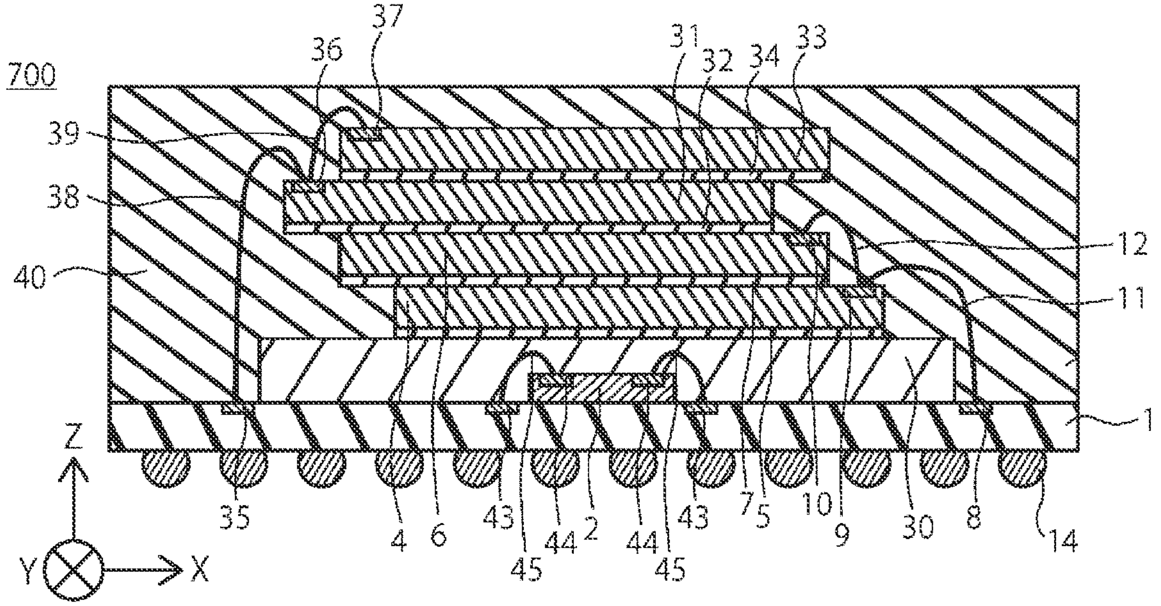
FIG. 38 is a schematic cross-sectional view of the semiconductor device according to one embodiment.

A seventh embodiment relates to a semiconductor device and a method of manufacturing a semiconductor device. FIG. 38 shows a schematic cross-sectional view of a semiconductor device 700. The semiconductor device 700 of the seventh embodiment is a modification of the semiconductor device 500 of the fifth embodiment.

In the semiconductor device 700 of the seventh embodiment, the first semiconductor element 2 is a bare chip, and the first semiconductor element 2 and the wiring board are connected by bonding wires 45. The bonding wires 45 connect the pads 43 of the wiring board 1 and the pads 44 of the first semiconductor element 2. Preferably, an adhesive layer is provided between the first semiconductor element 2 and the wiring board 1.

The third resin layer 30 of the semiconductor device 700 covers the bonding wires 45 that connect the first semiconductor element 2 and the wiring board 1. By adopting spin coating, the third resin precursor 30A can be applied under mild conditions, so that the third resin layer 30 can be formed without breaking the bonding wires 45. The method of manufacturing according to this embodiment can be adopted even when the first semiconductor element 2 and the wiring board 1 are connected by the bonding wires 45.

The third resin layer 30 can be formed regardless of the type of connection made between the first semiconductor element 2 and the wiring board 1. In the various forms of possible semiconductor devices, it is possible to reduce bonding wire formation defects and stress on semiconductor elements (such as stacked memory chips) by adoption of this method of forming the third resin layer 30, thereby contributing to an improvement in manufacturing yield.

Eighth Embodiment

Figure 39:
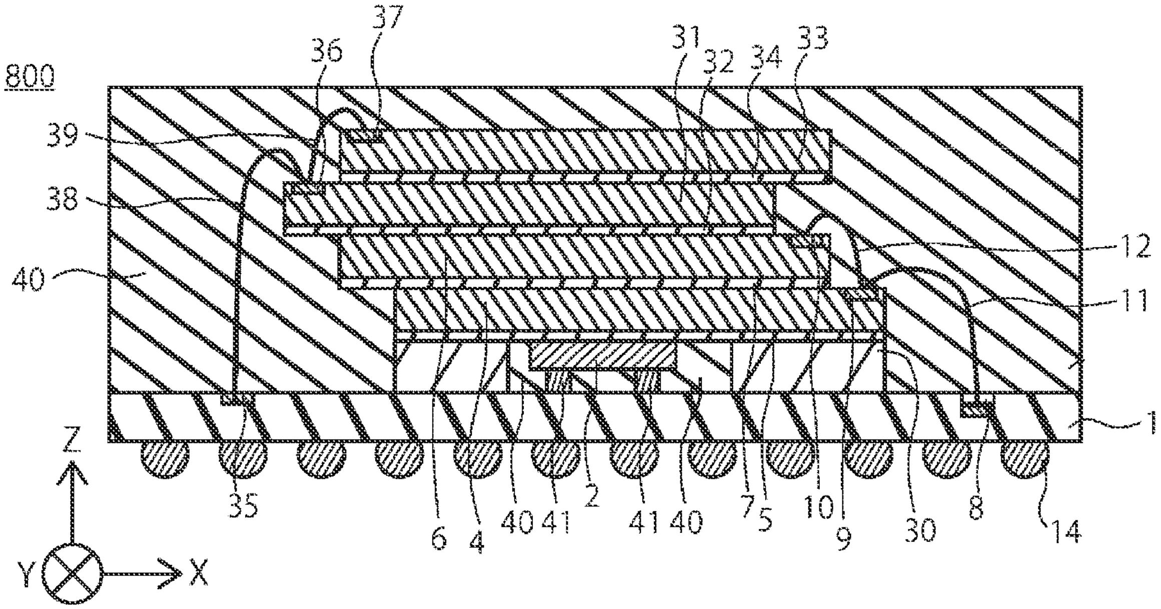
FIG. 39 is a schematic cross-sectional view of the semiconductor device according to one embodiment.

An eighth embodiment relates to a semiconductor device and a method of manufacturing a semiconductor device. FIG. 39 shows a schematic cross-sectional view of a semiconductor device 800. The semiconductor device 800 of the eighth embodiment is a modification of the semiconductor device 500 of the fifth embodiment.

In the semiconductor device 800 of the eighth embodiment, the first semiconductor element 2 is a flip chip. The first semiconductor element 2 is electrically connected to a pad on the upper surface of the wiring board 1 via a conductive adhesive 41. The semiconductor device 800 does not show an underfill.

The third resin layer 30 of the semiconductor device 800 is not provided past the bonding wire 11 and the bonding wire 38. Moreover, the third resin layer 30 is not provided directly surrounding the first semiconductor element 2, but rather the first semiconductor element 2 is first sealed with the fourth resin layer 40. In the step (S24) of opening the third resin layer 30 on the pad 8, by removing the third resin layer 30 outside the bonding wire 11 and bonding wire 38 and around the first semiconductor element 2, the semiconductor device 800 having the third resin layer 30 not in direct contact with the first semiconductor element 2 inside the pad 8 and pad 35 is obtained.

By controlling the thickness of the third resin precursor 30A, the formation of the third resin layer 30 on the upper surface side of the first semiconductor element 2 can be prevented. Even when the third resin layer 30 is not formed on the upper surface of the first semiconductor element 2, the flatness of the upper surface and side surfaces of the third resin layer 30 formed around the first semiconductor element 2 is high, and thus, it is possible to reduce bonding wire formation defects and stress on the second semiconductor element 4, thereby contributing to an improvement in yield.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, the method comprising:

placing a first semiconductor element on a wiring board;

forming a first mask having an opening on the wiring board so that the first semiconductor element is positioned in the opening;

putting a liquid first resin precursor into the opening of the first mask;

curing the first resin precursor to obtain a first resin layer;

removing the first mask;

placing a second semiconductor element on the first resin layer after the removing of the first mask;

forming a second mask having an opening on the wiring board so that the first resin layer and the second semiconductor element are positioned in the opening of the second mask;

putting a liquid second resin precursor into the opening of the second mask;

curing the second resin precursor to obtain a second resin layer;

removing the second mask; and connecting the second semiconductor element to the wiring board with a bonding wire, wherein the connecting of the second semiconductor element to the wiring board with the bonding wire occurs before the forming of the second mask.

2. The method according to claim 1, wherein the curing of the first resin precursor includes a heating process.

3. The method according to claim 1, wherein the first resin precursor is fully cured before the removing of the first mask.

4. The method according to claim 1, wherein the first mask is metal.

5. The method according to claim 1, wherein the first mask is photoresist.

6. The method according to claim 1, wherein the liquid first resin precursor has a viscosity of between 1 Pas and 200 Pas at 25° C.

7. The method according to claim 1, wherein the first mask includes a bridging structure that spans across a portion of the opening.

8. The method according to claim 7, wherein the bridging structure passes above a portion of the first semiconductor element.

9. The method according to claim 1, wherein the liquid first resin precursor is filled into the opening in the first mask by a spin coating method.

* * * * *